US 8,204,709 B2

(12) United States Patent
Presher, Jr. et al.

(10) Patent No.: US 8,204,709 B2
(45) Date of Patent: Jun. 19, 2012

(54) SYSTEM AND METHOD FOR MONITORING PHOTOVOLTAIC POWER GENERATION SYSTEMS

(75) Inventors: Gordon E. Presher, Jr., Fairport, NY (US); Carlton J. Warren, Webster, NY (US)

(73) Assignee: Solar Sentry Corporation, Pittsford, NY (US)

( * ) Notice: Subject to any disclaimer, the term of this patent is extended or adjusted under 35 U.S.C. 154(b) by 1440 days.

(21) Appl. No.: 11/333,005

(22) Filed: Jan. 17, 2006

(65) Prior Publication Data

US 2006/0162772 A1 Jul. 27, 2006

Related U.S. Application Data

(60) Provisional application No. 60/644,682, filed on Jan. 18, 2005, provisional application No. 60/670,984, filed on Apr. 13, 2005.

(51) Int. Cl.
*G01D 18/00* (2006.01)
(52) U.S. Cl. ........................................................ 702/88
(58) Field of Classification Search .................... 702/182
See application file for complete search history.

(56) References Cited

U.S. PATENT DOCUMENTS

| | | | |
|---|---|---|---|
| 4,445,030 A | 4/1984 | Carlton | |
| 4,794,909 A | 1/1989 | Eiden | |
| 5,669,987 A * | 9/1997 | Takehara et al. | 136/244 |
| 5,923,100 A | 7/1999 | Lukens et al. | |
| 6,046,401 A | 4/2000 | McCabe | |
| 6,180,868 B1 | 1/2001 | Yoshino et al. | |
| 6,189,866 B1 * | 2/2001 | Harkins et al. | 254/332 |
| 6,278,052 B1 | 8/2001 | Takehara et al. | |
| 6,515,215 B1 | 2/2003 | Mimura | |
| 6,545,211 B1 * | 4/2003 | Mimura | 136/244 |
| 6,624,350 B2 | 9/2003 | Nixon et al. | |
| 6,686,533 B2 | 2/2004 | Baum et al. | |
| 2004/0211456 A1 | 10/2004 | Brown et al. | |
| 2007/0114422 A1 * | 5/2007 | Berkcan et al. | 250/358.1 |

FOREIGN PATENT DOCUMENTS

JP 2000269531 9/2000

OTHER PUBLICATIONS

Unofficial International Search Report and written opinion dated Sep. 21, 2007 for International PCT patent application PCT/US2006/001681 corresponding to pending U.S. Appl. No. 11/333,005.
Unofficial European Search Report and written opinion dated Jan. 14, 2009 for European patent application 06718714.6 corresponding to pending U.S. Appl. No. 11/333,005.
JP2007551475—An Unofficial Japanese Office Action (With Translation) Dated Jul. 19, 2011 for Japanese Patent Application JP2007-551475 Filed Jan. 18, 2006, Published Jul. 24, 2008, As 2008-527749; Corresponding to U.S. Appl. No. 11/333,005 Inventor: Gordon E. Presher, Jr. et al.
JP2000269531—An Abstract and Machine Translation of JP2000269531, Published Sep. 29, 2000; (Application JP2000-001206, Filed Jan. 7, 2000) Owner Canon Inc; Inventor Mimuratoshihiko.

* cited by examiner

*Primary Examiner* — Aditya Bhat

(57) ABSTRACT

A system and method for monitoring photovoltaic power generation systems or arrays, both on a local (site) level and from a central location. The system includes panel and string combiner sentries or intelligent devices, in bidirectional communication with a master device on the site to facilitate installation and troubleshooting of faults in the array, including performance monitoring and diagnostic data collection.

58 Claims, 16 Drawing Sheets

SYSTEM AND METHOD FOR MONITORING PHOTOVOLTAIC POWER GENERATION SYSTEMS

The present application claims priority from U.S. Provisional Patent Application Ser. No. 60/644,682, filed Jan. 18, 2005, for WIRELESS HOST-BASED DIAGNOSTIC AND MONITORING SYSTEM FOR PHOTOVOLTAICS, and from U.S. Provisional Patent Application Ser. No. 60/670,984, filed Apr. 13, 2005, for WIRELESS DIAGNOSTIC AND MONITORING SYSTEM FOR PHOTOVOLTAIC SYSTEMS, both of which are hereby incorporated by reference in their entirety.

The field of the present invention is directed to photovoltaic power generation, and more particularly to systems and methods for monitoring photovoltaic power generation systems, including performance monitoring and diagnostic data collection.

BACKGROUND AND SUMMARY

Commercial photovoltaic systems consist of large arrays of photovoltaic (PV) panels, which together conventionally generate between thirty kilowatts and one megawatt of power in full sunlight. Such systems are often grid-connected and located on flat-roofed commercial buildings for economic, safety and security reasons. Since the average photovoltaic panel used in these systems produces a maximum power of about one hundred fifty watts, there are conventionally between several hundred to several thousand individual photovoltaic panels in a commercial system.

The arrays of photovoltaic panels are conventionally connected electrically in multiple strings. Each string consists of ten to twenty or more photovoltaic panels wired in series, generating a maximum current of between five and ten amps at a maximum voltage of five hundred to six hundred volts (DC). A conventional one hundred fifty kilowatt commercial photovoltaic system has about one thousand photovoltaic panels in the array and may cover an area of approximately forty thousand square feet. The panels are arranged in fifty to one hundred strings, which are then subsequently connected in parallel in string combiners and wired to one or more inverters.

An inverter performs the function of converting the direct current power produced by the array of photovoltaic panels to alternating current for use by the customer, or for feeding back to the utility power grid. For such a system, the inverter weighs around four thousand pounds, pretty much ensuring that it is ground-mounted, and probably located near the traditional electric meter or utility interface that separates the electric power grid from the building power system. These electrical connections are illustrated, for example, in FIG. 8 where, for simplicity, only one string combiner and one inverter are shown. It will be appreciated that large systems will certainly have more than one string combiner and often more than one inverter.

The limitations and problems of conventional photovoltaic systems, particularly commercial installations, include: a lack of self-diagnostics to identify wiring or panel faults, difficulty in discerning performance, both on an individual panel level as well as a string or system level, and a lack of actionable diagnostic and performance information.

The lack of self-diagnostic features in photovoltaic power generation systems results in spotty system quality that is highly dependent on the skill and care of the installers. Unfortunately, this often results in a common complaint that "we need more highly trained installers in the photovoltaic industry." What is actually needed is a higher level of system sophistication with built-in diagnostics so that the installers do not need to be as highly trained. Highly reliable photovoltaic panels and interconnections can and do fail, or partially fail, but the power generation capability of photovoltaic installations is also affected by issues such as panel shading and/or soiling. While many, if not most, commercial photovoltaic installations are instrumented with respect to total power output, most panel or string-level failures are difficult to discern and virtually impossible to diagnose and locate without sending a qualified technician to the site.

The power generation performance of a photovoltaic system, that might include thousands of photovoltaic panels, depends on the power generation performance and connection of each individual panel. And yet, with today's products and interconnection methods, this information remains unavailable. In fact, many failures that affect power generation performance, sometimes significantly, are completely undetectable. In a large photovoltaic system, it is possible for five to ten percent of the equipment on the roof to never even be attached and have the situation go undetected. Even when data collection suggests that the power generation performance is sub-par, there is no little or no actionable information to assist in the diagnosis and repair of the problem. To find the problem, the technician needs to literally go on the roof, take apart the system and make measurements with hand-held instrumentation. Care must be taken during this process, since lethal voltages and currents are generated when the sun is out and there are no switches in the system to turn this power off.

A solution to the problem involves electronically collecting data from each photovoltaic panel in the array. As part of the solution, an automatic a process has been developed by which photovoltaic panels are easily identified and addressed, and those addresses associated with physical locations. As an example of an analogous situation, consider a computerized office with a network. Now consider installing several-hundred or more networked printers on the computer network, where each printer is a plug-and-play printer so that receives an address. Although a user may be able to "see" and print to each of the printers, without more information (e.g., a description indicating the location of the printer), the user would have little likelihood of success picking a desired printer to use as the user would have to distinguish between self-assigned printer names having few distinguishing characters.

The same potential problem exists for large photovoltaic installations—there is no addressing protocol that, even if there is a determination of a wiring fault or poor performance, would enable easy location and repair or replacement of panels and wiring. Hence, one aspect of the present invention is directed to an efficient protocol to enable intelligent or smart panels to self-identify so as to associate the panel with a string, and determine the panel's position within the string, so as to enable reliable, repeatable (e.g., upon replacement of a panel in a string) addressing to quickly identify a panel's location within an array without having to enter, record and track pre-programmed panel identification data such as serial numbers and the like. Moreover, the addressing protocol disclosed in accordance with an aspect of the present invention further permits verification of the panel upon installation/replacement in order to facilitate installation, later shifting of panels, etc.

This lack of information also affects the installation process resulting in both higher installation costs and lower average system quality. Systems are wired and tested manually at each step of the way. Errors, which can be costly when they occur, are avoided only by trained technicians with handheld instrumentation performing methodical test, measurement and installation processes effectively and fastidiously.

There are, in the marketplace, inverters called string inverters, which conventionally have a capacity of two to six peak kilowatts each. It is possible to build a commercial photovoltaic system using many of these relatively small inverters, and in that case there is information available as to the power output of each string of photovoltaic panels (usually between ten and twenty panels). Building photovoltaic power systems using string inverters provides some level of localization of wiring failures and performance problems.

However some shortcomings of using multiple string inverters in large commercial systems versus using one inverter include: the higher cost of multiple inverters; the higher weight added to a building roof; significant additional wiring cost; the lack of panel level performance information; and the problems in the installation process previously mentioned are not solved. Further, significant data processing problems in aggregating performance information for an entire photovoltaic power generation site are not addressed. Consequently standardized data collection, analysis and reporting for multiple sites is not yet possible.

Therefore, one aspect of the present invention is directed to a panel sentry for monitoring a photovoltaic panel, comprising: a source of power; a first circuit for detecting a power characteristic of the photovoltaic panel and producing a first signal representing the power characteristic of the photovoltaic panel; an electrical conductor serially connecting a power terminal of the photovoltaic panel to a power terminal of an adjacent panel; a second electrical conductor, also connected to the adjacent panel, said second conductor carrying a signal indicating a power characteristic of the adjacent panel; a second circuit for producing a second signal representing the power characteristic of the adjacent panel; and a transmitter for transmitting the first and second signals, said transmitter being powered by the source of power.

A further aspect of the present invention is directed to a method for monitoring the performance of a plurality of photovoltaic panels in an array, comprising: requesting datasets from a plurality of string sentries associated with the array, wherein the request includes status information for every string sentry and every panel sentry associated with the array; and collecting, using a bidirectional communication channel, and storing datasets from a master string sentry.

Yet another aspect of the present invention is directed to a method for addressing a plurality of monitoring devices, each monitoring device associated with a photovoltaic panel in an array of panels, comprising: initiating a request for information from a string of panels in the array; a string sentry selects a string address and initiates bi-directional communication with the string by sending a query; and the query is received and a response is generated for transmission by a panel sentry, wherein the panel sentry transmits its string and panel information to at least one adjacent panel in the string.

Yet a further aspect of the invention is directed to a method for the configuration and installation of a photovoltaic panel array, comprising: establishing as a minimal site computer configuration, a number of panels per string; placing at least one string sentry and a site computer in an installation mode; repeatedly polling the at least one string sentry to request data relating to the string sentry and any photovoltaic panels connected thereto; and receiving, at a panel sentry associated with a photovoltaic panel, a request and transmitting a response to the request, wherein the data transmitted includes a location identifier for the panel sentry, wherein upon receiving a subsequent request the panel sentry will also receive panel status data for driving a panel indicator associated therewith.

Another aspect of the present invention is directed to a panel sentry for monitoring a first photovoltaic panel, the panel sentry including a source of power, a first panel voltage detector detecting a first voltage produced by the first panel and producing a first signal representing the first voltage, a microcontroller in bi-directional communication with an external device and electrically connected to the first panel voltage detector and electrically connected to the source of power, the microcontroller receiving the first signal from the first voltage detector and transmitting the first signal to the external device and a memory storing a digital representation of the first signal.

Another aspect of the present invention is directed to a string sentry for monitoring at least one string of photovoltaic panels the string sentry including a source of power, a current detector detecting the total current produced by a string of panels and producing a signal representing the current, a microcontroller in bi-directional communication with at least one external device and electrically connected to the current detector and electrically connected to the source of power, the microcontroller receiving the signal from the current detector and transmitting the signal to the external device and a memory storing a digital representation of the signal representing the current.

A further aspect of the present invention is directed to a method for monitoring at least one string of photovoltaic panels including collecting, using a string sentry, a value of a current from a string of photovoltaic panels, storing, in the string sentry, the value of the current of a string of photovoltaic panels and transmitting the value of the current from the string sentry to an external computer.

Yet another aspect of the present invention is directed to a system for monitoring an array of photovoltaic panels the system including a plurality of panel sentries, each panel sentry electrically connected to a panel, a plurality of string sentries, each string sentry electrically connected to at least one string of panels, a site data concentrator in bi-directional communication with all string sentries in the system and a site computer in bi-directional communication with the site data concentrator and with an external computer.

A further aspect of the present invention is directed to a method for monitoring an array of photovoltaic panels the method including collecting, from all strings of panels in the array, a value of a current of the string, storing, in a site computer, the value of the current of the string of all strings of panels in the array, computing, using the site computer, an operational status of the array, making the stored value of the current of the string, of all strings of panels in the array, available for access and making the operational status available for access.

Yet another aspect of the present invention is directed to a system for monitoring one or more arrays of photovoltaic panels the system including a plurality of panel sentries, each panel sentry electrically connected to a panel, a plurality of string sentries, each string sentry electrically connected to a plurality of strings of photovoltaic panels, a plurality of site data concentrators, each site data concentrator in bi-directional communication with a site computer and in bi-directional communication with at least one string sentry in an array, a plurality of site computers each site computer in bi-directional communication with both a site data concentrator and a central computer, and the central computer in bidirectional communication with all site computers in the system, the central computer including a memory, the memory storing information transmitted from at least one of the site computers.

A further aspect of the present invention is directed to a method for monitoring one or more arrays of photovoltaic panels the method including monitoring all panels in all arrays using a panel sentry electrically connected to each panel, monitoring all groups of strings of panels in all arrays using a string sentry, each string sentry electrically connected to a group of strings, storing, in a central computer, a value of a current of a string, from all strings of panels in all arrays being monitored, storing, in the central computer, an operational status of all arrays being monitored, making the stored value of the current of the string, of all strings of panels in all arrays being monitored, available for access; and making the operational status, of all arrays being monitored, available for access.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION

Figure 1:
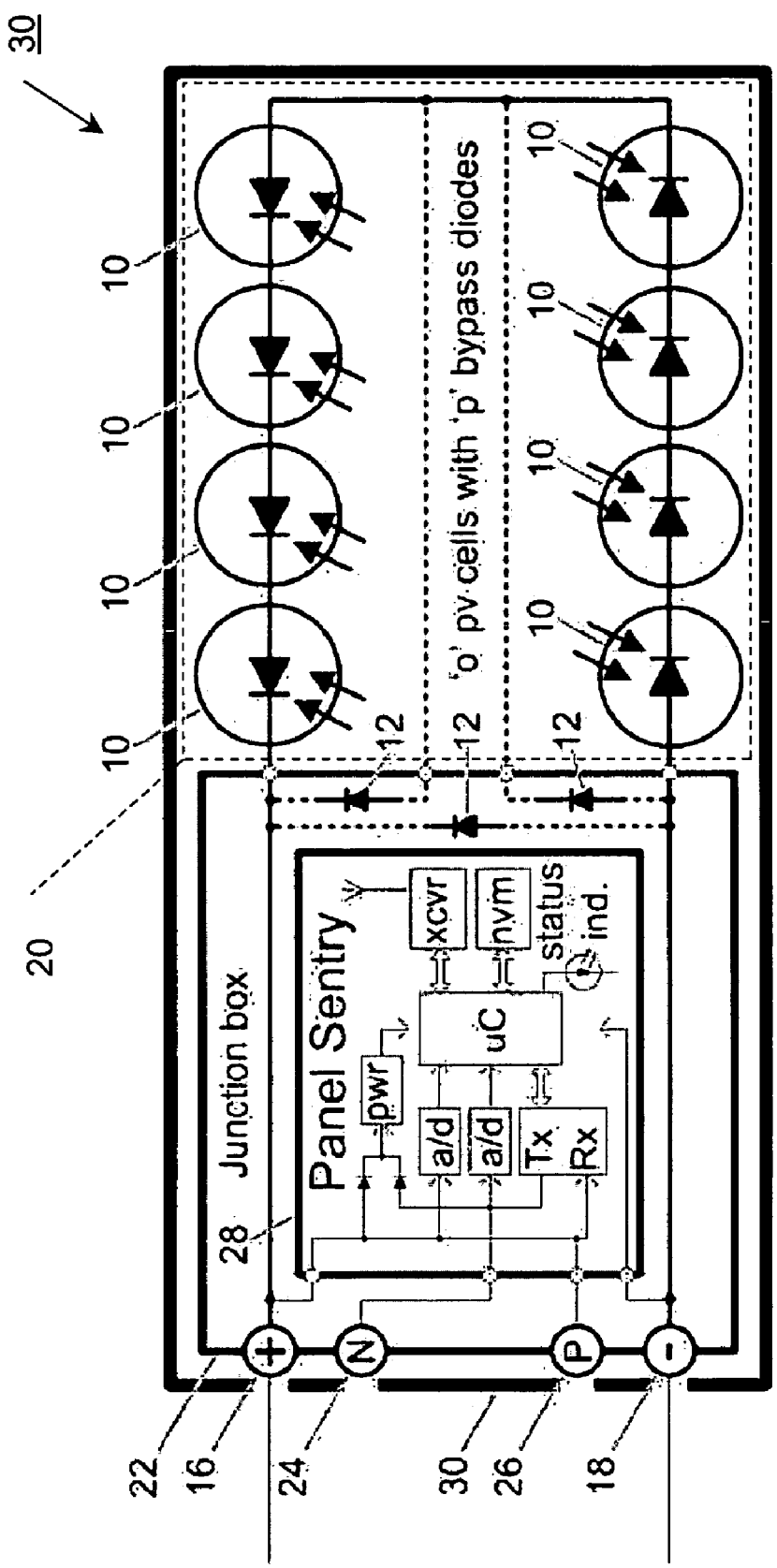
FIG. 1 is an electrical schematic view of a smart photovoltaic panel, which is a photovoltaic panel with a panel sentry mounted in the cover of its electrical junction box.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like references have been used throughout to designate identical or equivalent elements. It is also noted that the various drawings illustrating the present invention are not drawn to scale and that certain regions have been purposely drawn disproportionately or in a partial format so that the features and concepts of the present invention could be properly illustrated.

The present invention is, in part, concerned with photovoltaic panels which are devices containing one or more electrically interconnected photovoltaic cells. A string of photovoltaic panels is one or more photovoltaic panels producing a combined current therefrom. A string combiner is a device that receives, as input, power from one or more strings of photovoltaic panels and produces a combined current. An array of photovoltaic panels is a group of photovoltaic panels, generally producing a combined current. An array of photovoltaic panels may contain multiple strings of photovoltaic panels and multiple string combiners.

FIG. 1 is an electrical schematic view of what applicants have termed a "Smart Panel" 30, which is a photovoltaic panel 20 with a panel sentry 28 associated therewith. As depicted in the embodiment of FIG. 1, the panel sentry 28 is mounted in the cover of an electrical junction box 22 as found on a conventional photovoltaic panel. A conventional photovoltaic panel is modified, in accordance with one embodiment of the present invention to replace the conventional junction box with one having expanded functionality. The function of the junction box 22 includes providing mounting locations and interconnections for the positive panel terminal 16, the negative panel terminal 18, the next panel terminal 24, the previous panel terminal 26, and the panel sentry 28. Junction box 22 optionally provides mounting locations for optional bypass diodes 12. In one embodiment of the present invention, the panel sentry 28 is embedded within and/or attached to a junction box cover, whereby a conventional panel can be easily configured as a smart panel.

It is common practice to place one or more bypass diodes 12 across all or part of the strings of photovoltaic cells 10, so that a cell or wiring failure in the string of cells only partially disables the operation of the photovoltaic panel 20. For example, British Petroleum (BP Solar) manufactures a photovoltaic panel 20 with seventy-two photovoltaic cells 10 in series, generating an open circuit maximum voltage of 45 V.D.C. and a voltage at peak power of 36 V.D.C. It has six bypass diodes 12, one across every 12 photovoltaic cells 10. Therefore a single cell or connection failure will cause the peak power voltage to be reduced to 83% of the original value, or 30 V.D.C. When placed in a string of panels 200 that includes 12 panels, the single failure as described has the effect of reducing the peak power voltage of the string from 434 V.D.C. to 428 V.D.C., a small amount. On the other hand, without at least one of the bypass diodes 12, a single connection failure in one of the 12 panels would reduce the power output of the entire string to zero.

It is also common practice in the manufacture of photovoltaic panels to include a panel junction box on the rear or back (away from the sun) surface of the panel. The primary purpose of the junction box is to provide a place to terminate the internal string(s) of photovoltaic cells 10 and provide two terminations for the user, the positive panel terminal 16 and the negative panel terminal 18. These two terminations are the positive and negative connections to the D.C. power generated by the photovoltaic panel 20. They represent the only connections to the panel that are provided and used on electric power generating systems at present. A common, though not universal, secondary use of the panel junction box 22 is to provide mounting locations and terminations for whatever bypass diodes 12 are used in the panel.

The function of the next panel terminal 24 is to terminate a wire that is connected to the previous panel terminal 26 of the next panel in the string. For the last panel in a string, this terminal is for terminating a wire that is connected to the last panel terminal 54 of a smart string combiner 50 as depicted in FIG. 3. The function of the previous panel terminal 26 is for terminating a wire that is connected to the next panel terminal 24 of the previous panel in the string. For the first panel in a string, this terminal terminates a wire that is connected to the first panel terminal 58 of the smart string combiner 50. The use of the second wire, for example in the embodiment of FIG. 2 or 7, permits a panel to collect information relative to an adjacent (next) panel. In the simplest form, the second wire may be considered a "channel" for information to flow between panels—whether it be the specific communication of data, as in a network, or simply a signal representing a voltage from the next panel or a combination of the two.

The panel sentry 28 performs real-time measurement of the output voltage of the photovoltaic panel to which it is mounted. In one embodiment, the panel sentry may also perform real-time measurements of the next panel in the string. The panel sentry averages both the panel voltage and the next panel voltage over a designated update period. In one embodiment, the panel sentry also displays real-time visual status for the panel and the wiring adjacent to the panel based on the input from a remote computer. The panel sentry stores and retrieves panel and panel sentry 28 configuration information such as manufacturer info. In this embodiment, the panel sentry communicates the aforementioned information over a bidirectional data link. The bidirectional data link may include wired or wireless communications technologies.

In one embodiment, the wireless communication employs radio-frequency signals similar to well-known computer and commercial devices. In an alternative embodiment, the present invention contemplates the use of optical or opto-electronic communications (e.g., infra-red, etc.) to provide the wireless communications between at least some components of the system (e.g., panel sentry to panel sentry). Furthermore, the wired embodiment is contemplated to include not only traditional networked wiring (e.g., single (FIG. 7) and multi-wire networks), but may also be implemented by the imposition of communications signals over the D.C. power conductors so as to permit the use of the D.C. power wiring (conductors) to act as a component of the communication network. The panel sentry can automatically resolve the mapping of physical panel location within the electrical wiring diagram to wireless network addresses based on the physical location information received from the previous panel during installation of the array. In other words, the panel sentries within a string, and within an array, are self-addressing as a result of communication with the associated site sentry in the string combiner as will be further described below.

Figure 2:
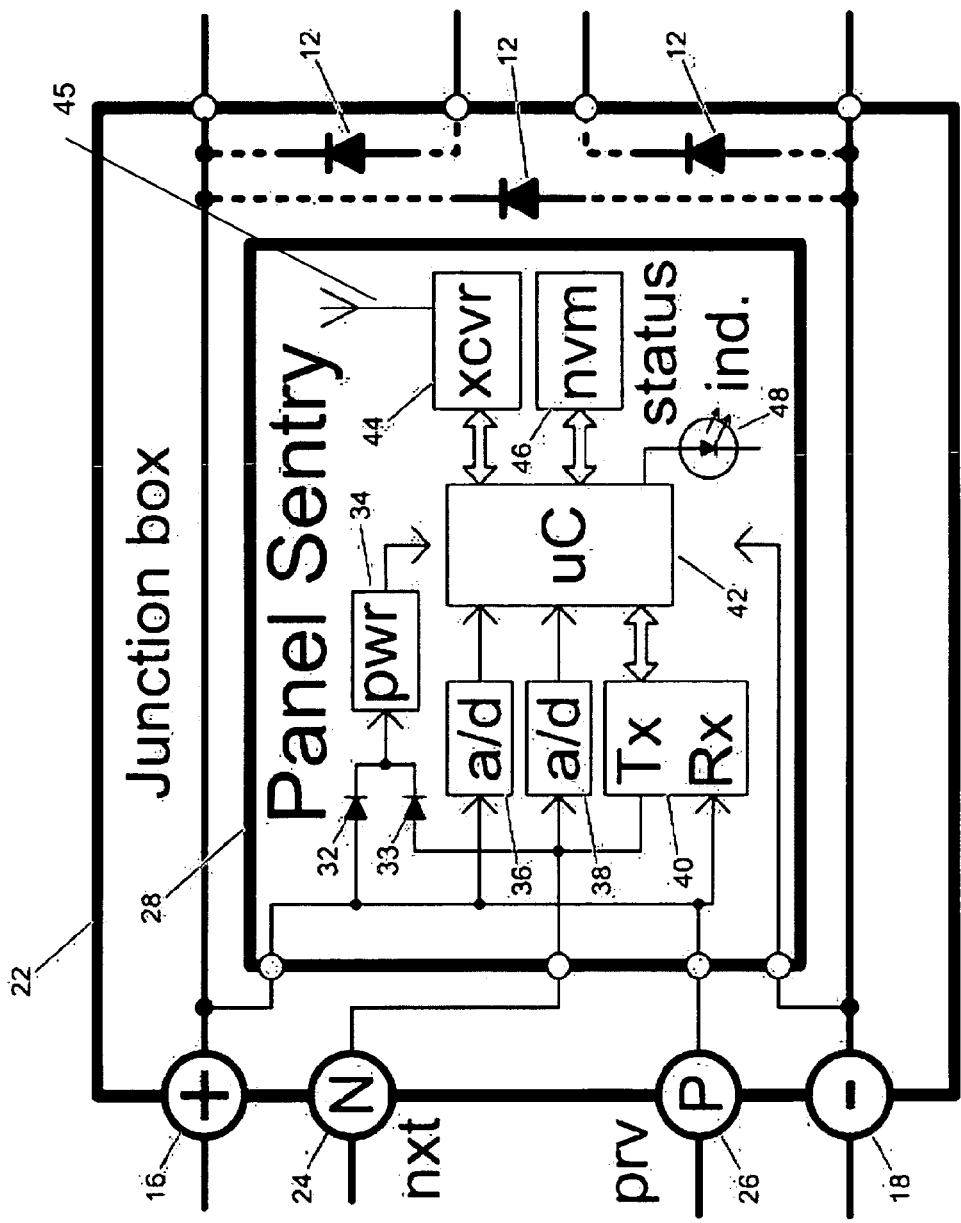
FIG. 2 is an electrical schematic view of a panel sentry.
Figure 3:
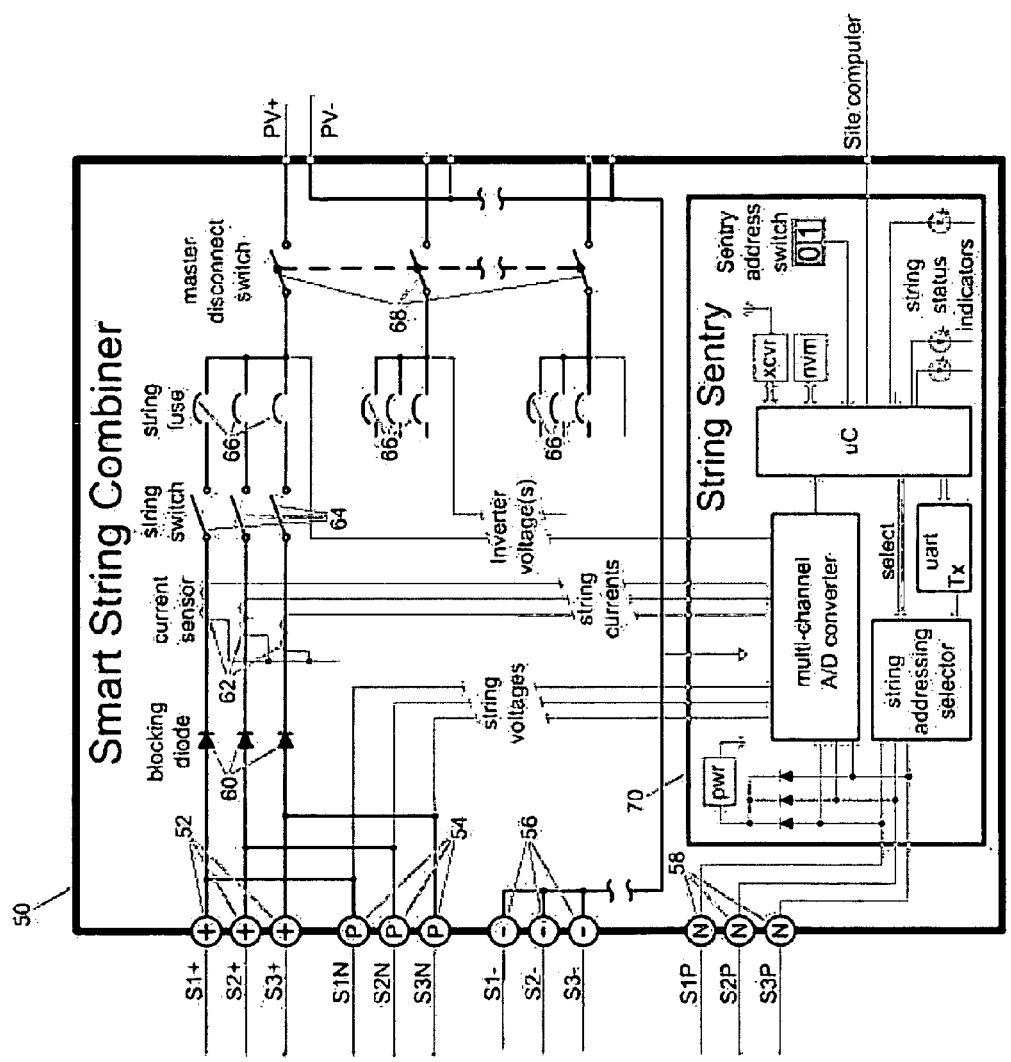
FIG. 3 is an electrical schematic view of a smart string combiner, which aggregates the power from a plurality of strings of photovoltaic panels and monitors performance information using a string sentry.

FIG. 2 is an expanded view of panel sentry 28. Panel sentry 28 measures the output voltage of a photovoltaic panel, and possibly its adjacent panel, stores a representation of the output voltage and then wirelessly transmits data indicating the voltages. The panel sentry further displays visual status information for panel 30 to which it is attached. The function of the panel voltage isolation diode 32 is to provide panel voltage to the panel power regulator 34, and to thereby act as a power source for the panel sentry 28 electronics depicted in FIG. 2. Power regulator 34 also isolates the panel voltage from the next or adjacent panel voltage when the optional redundant method of powering the panel sentry 28 is implemented. When redundant power for the panel sentry 28 is not implemented, this diode can be replaced with a direct interconnection such as a section of wire. The function of the next panel isolation diode 33 is to provide the next panel voltage to the panel power regulator 34 that is used to power the panel sentry 28 electronics. It also isolates the panel voltage from the next panel's voltage when the optional redundant method of powering the panel sentry 28 is implemented. When redundant power for the panel sentry 28 is not implemented, this diode can also be removed, in this case leaving an open-circuit. The function of the panel power regulator 34 is for deriving a regulated low voltage for powering the panel sentry 28 from a much higher and unregulated panel voltage. In yet a further alternative embodiment, power for the panel sentry may be provided by a battery or other rechargeable or replenishable power source, possibly including a capacitive storage device.

The panel sentry 28 further includes a device for detecting and monitoring the voltage produced by the panel. In one embodiment, a panel voltage analog-to-digital (A/D) converter 36 is employed for converting the measured panel voltage to a digital value for output to, and use by, the panel microcontroller 42. A second or next panel analog-to-digital converter 38 is employed for converting the measured panel voltage for the next panel in the string of panels 200 (e.g., FIG. 7) to a digital value, once again for use by the panel microcontroller 42. Also included in the panel sentry 28 is a panel location transceiver 40, for receiving (RX) from the previous panel terminal 26 the number of panels in the string and the physical location of the previous panel—as designated by string number and panel number, and then transmitting (TX) to the next panel terminal 24 the number of panels in the string and the physical location of this panel.

For the first panel in a string, the panel receives the appropriate string number, with a panel "0" designation to signify that it is connected directly to a smart string combiner 50 as will be described in more detail below. Some functions of the panel microcontroller 42 include the execution of information storage and retrieval, input-output, numerical, logical and communications functions for the panel sentry 28. The function of the wireless panel transceiver 44, including antenna 45, is for transmitting and receiving wireless data communications between a panel sentry 28 and a string sentry 70. Panel sentry 28 further includes panel non-volatile memory 46 for storing and retrieving data pertinent to the operation of the diagnostic and monitoring system. Such data may include, but is not limited to, manufacturing information for the photovoltaic panel and the panel sentry 28, the last physical location for the smart panel 30 in the array, as well as panel sentry 28 calibration data. Finally, the panel sentry also includes a panel status indicator 48 for visually displaying or indicating real-time panel status information based upon input from the panel sentry or a remote computer. When the indicator is operating in response to a remote computer, it may display or indicate information received via the wireless panel transceiver 44 or the panel location transceiver 40. In fault conditions where remote communications are not operable, the panel status indicator 48 will be controlled by the panel microcontroller 42. It will be appreciated that alternative colors and/or display patterns may be employed to provide information via the indicator 48 to a technician installing or servicing the panel.

It will also be appreciated that although the indicator 48 is depicted as being placed within the panel sentry, integrated with the junction box or cover thereof, alternative locations for the indicator may also be possible (e.g., along an edge, on or adjacent a surface of the photovoltaic panel, to make the indicator(s) easier to view by an installer or service technician. One advantage of the indicator is that the bidirectional communications may be employed to cause the panel sentry to alter the state of the indicator(s) in a manner to permit information to be communicated to an installer or service person, based upon information not available to the panel sentry. For example, the indicator may be of a color or blinking pattern that indicates that the panel sentry has been correctly installed, has received its "address" within the system, has a fault, is adjacent a wiring fault, etc., which information may come from the site or central computer.

Turning next to FIG. 3, there is depicted a block diagram of a smart string combiner 50, which aggregates the power from a plurality of strings of smart panels 30, as well as provides safety features and monitors vital performance information using an integral string sentry 70. The string combiner 50 includes a plurality of positive terminals 52 for terminating a wire from the positive panel terminal 16 of the last smart panel 30 in each string of panels 200. The positive panel terminal is the positive side of each direct current string output voltage. The string previous terminals 54, as noted above, terminate a wire from the next panel terminal 24 of the last smart panel 30 in each string of panels 200. The function of the string negative terminals 56 is for terminating the wire from the negative panel terminal 18 of the first smart panel 30 in each string of panels 200. The negative panel terminal is the negative side of each direct current string output voltage. The first panel terminals 58 terminate the wire from the previous panel terminal 26 of the first Smart Panel 30 in each string of panels 200.

Figure 7:
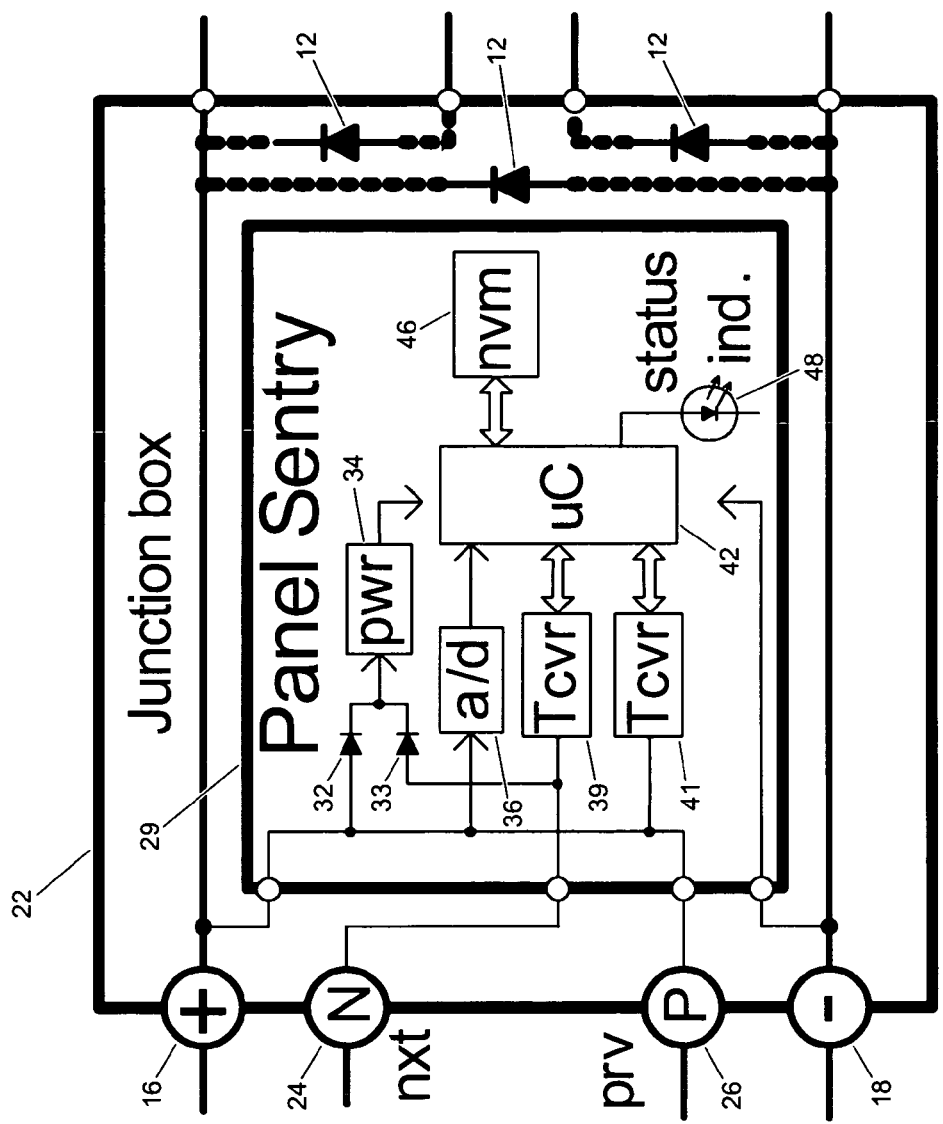
FIG. 7 in an electrical schematic view of an alternate embodiment of a panel sentry.

Also included in the sting combiner 50 are blocking diodes 60 for permitting the flow of power from each string of panels or smart panels, while preventing power from flowing back into any underperforming strings. Conventionally, blocking diodes 60 are optional components in electrical systems, but standard components in the smart string combiner 50. String combiner 50 further includes a plurality of current sensors 62, one for each string, for sensing the current in each string of smart panels. Furthermore, each string may be controlled using a string switch 64 for switching off current for a particular string of smart panels. String fuses 66 limit string current for each string of smart panels as is well known for such systems to meet electrical code requirements. Referring also to FIG. 7, a master disconnect switch 68 is also provided for connecting and disconnecting the strings 210, at the smart string combiner 50, from one or more inverters 202.

String combiner 50 further includes a string sentry 70. In general, the string sentry operates under the control of a microcontroller (μC) 82 and provide the following functionality: aggregating fault information and performance data for multiple strings of smart panels, determining component failures, determining the status of switches, computing the locations of any wire breaks or faults, and providing appropriate real-time visual status indication based on information received from a site computer.

Figure 4:
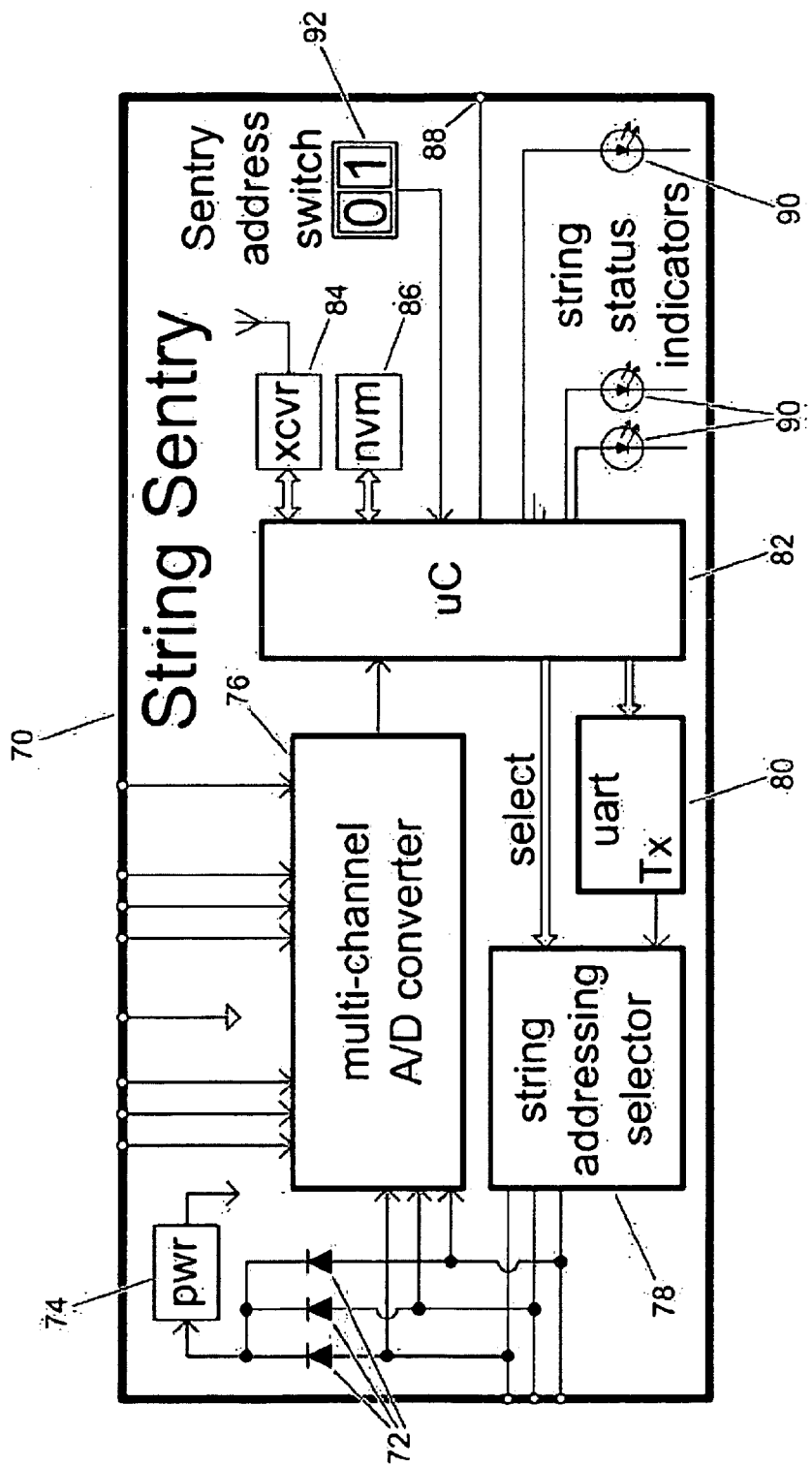
FIG. 4 is an electrical schematic view of a string sentry, which monitors the performance of strings of photovoltaic panels attached to a smart string combiner.

Referring also to FIG. 4, there is shown an enlarged view of the string sentry 70. As noted above, the string sentry monitors voltages and currents from strings of photovoltaic panels as well as the voltage output(s) to the inverter(s) 202, which is/are attached to a smart string combiner 50. String sentry 72 includes a plurality of panel blocking diodes 72 to permit any of the first panels from any string of panels 200 to provide power for the panel sentry 28, while preventing or "blocking" power from flowing back into those panels from the others. The function of sentry power regulator 74 is to produce a regulated low voltage for powering the string sentry 70 from a much higher and unregulated panel voltage input to the string sentry.

Within the string sentry, a multi-channel A/D converter 76 is connected to the strings, current sensors and the inverter power lines to convert measured string voltages, string currents and inverter voltages, respectively, to digital values for input to the string microcontroller 82. A string addressing selector 78 is also included. The selector operates to select a string to receive addressing information from the string microcontroller 82 via the serial addressing transmitter (UART) 80. Subsequently, serial addressing transmitter 80 transmits serial addressing information from the string sentry 70 via the string addressing selector 78 to the first smart panel 30 in the selected string.

The string microcontroller 82 provides programmatic control of the string sentry. In particular, the microcontroller 82 controls the execution of commands for information storage and retrieval, input-output, numerical, logical and communications functions for the string sentry 70. Within the string sentry, the wireless string transceiver 84 is employed for transmitting and receiving wireless data communications between a string sentry 70 and each panel sentry 28 in one of the serial strings of smart panels that are attached to that string sentry. The transceiver also transmits and receives data via wireless data communications between a string sentry 70 and the master string sentry (in one embodiment one of a plurality of string sentries may be configured to act as a master).

Figure 5:
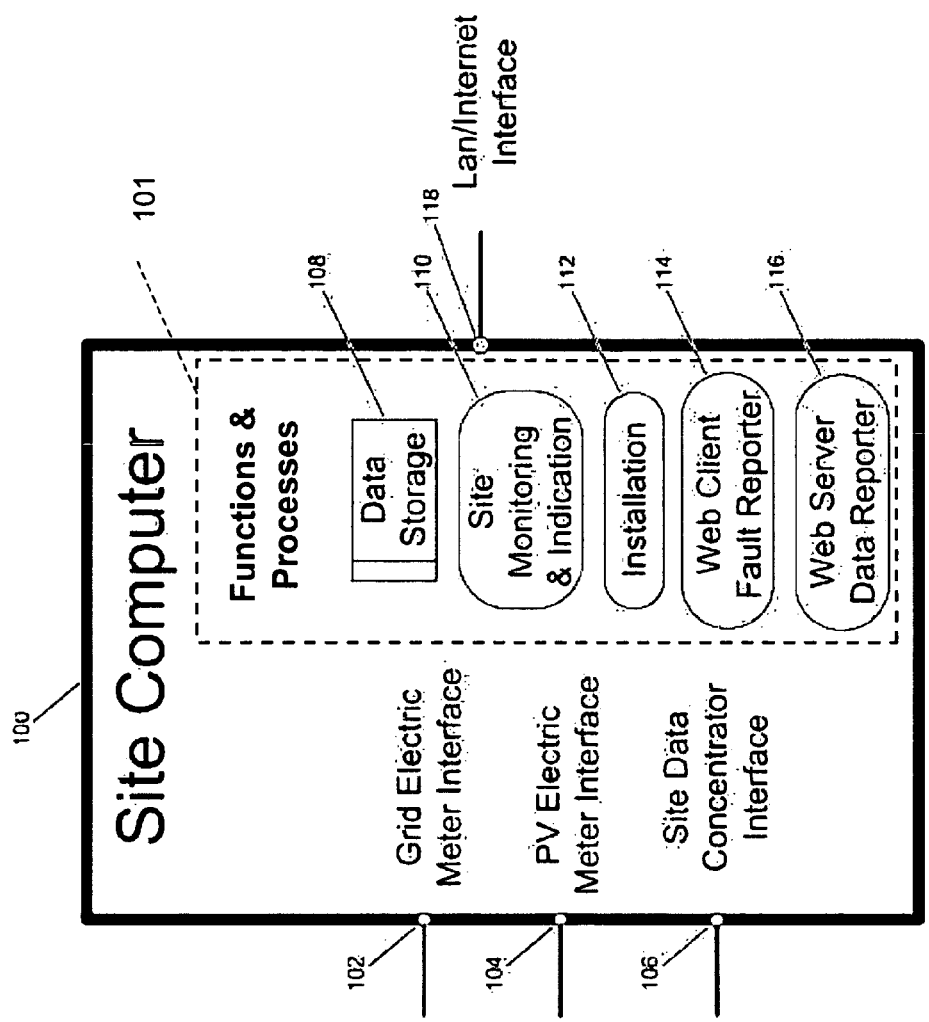
FIG. 5 is a function diagram view of a site computer for monitoring the status of a photovoltaic array.

String sentry 70 further includes non-volatile memory 86 for storing of certain data pertinent to the operation of the diagnostic and monitoring system including, but not limited to, manufacturing information for the string sentry, string sentry calibration data; as well as fault data and performance information for all the smart panels that are attached to that string sentry. Where the string sentry 70 is configured as the master string sentry, the site data channel 88 is employed to provide aggregated site data communications between the master string sentry and the site computer 100 to facilitate the site computer's various functions and processes. In one embodiment, the site data channel employs CAT5 Ethernet. In yet another alternative embodiment, the site computer functions and processes 101 are resident in the master string sentry, and the CAT5 Ethernet port is used for the LAN/Internet Interface 118 (FIG. 5). String status indicators 90 are provided in the string sentry to visually display real-time status information for each string of panels 200 attached to a smart string combiner 50. Sentry address switch 92 provides a physical/network address for each smart string combiner 50 in the array system, and is preferably set during the installation process. The master string sentry, as described above, would be identified as the string sentry 70 having its sentry address switch 92 set to "00".

Turning now to FIG. 5, there is depicted a functional block diagram of the site computer 100 and its associated functions and processes 101. In one embodiment, the site computer operates to monitor the status of a photovoltaic power generation site. At least three interfaces are provided by the site data computer: grid electric meter interface 102, photovoltaic electric meter interface 104 and site data concentrator interface 106. The grid meter interface 102 permits the site computer to collect energy purchase and/or sale readings from the electric meter that connects the power grid to the facility A.C. power wiring. The photovoltaic (PV) meter interface 104 enables the collection, by the site computer, of energy generation readings from an electric meter that connects the inverter's A.C. output to the facility's A.C. power distribution system. Lastly, the site data concentrator interface 106 permits the collection of fault and monitoring data for the entire facility, including the photovoltaic power generation site.

Several functions are set forth in FIG. 5 in relation to the site computer 100. During the operation of the site computer 100, the site data storage function 108 facilitates the storage and retrieval of fault data and monitoring information for the entire power generation site, and the storage of the information into a memory. For example, when using the preferred embodiment of a panel sentry 28, a wire break is detected between a smart solar panel 30 and the next smart solar panel in the series-string of smart solar panels 220 as follows. The panel sentry measures zero volts for the next panel in the series-string using its next panel analog-to-digital converter 38. It then transmits the data to the string sentry 70 which in turn relays the information to the site computer 100. When processing that measurement for zero volts, the site computer determines that one of the wires is broken between the smart solar panel that originated the information and the next smart solar panel. The site computer then looks at the measurement for string voltage from the last panel terminal 54 of the smart string combiner 50 for that string. If that voltage measurement is also zero, the site computer concludes that the power wire is broken between the two suspect smart solar panels. If the string voltage is normal, the site computer concludes that the signal wire between the next panel terminal 24 and the next solar panel's previous panel terminal 26 is broken. The fault data is then stored by the data storage function 108 for retrieval from the site computer and/or for transmission to a monitoring system via the interface 118.

The function of the site monitoring and indication process 110 is to monitor the performance and indicate status and/or failure information. The function of the installation process 112 is for guiding the installation of the power generation components, such as smart panels and string combiners, by prompting and communicating with the site installation technicians. The site computer also performs the function of a web client fault reporter 114, for reporting faults in real-time to a centralized computer attached to the Internet. In response to such a report, a centralized computer may dispatch a service technician to the site for remediation of the fault. Lastly, the web server data reporter process 116 operates to report fault data and comprehensive performance information for the electric power generation site as requested by a central computer attached to the Internet, again via the LAN/Internet interface 118.

In one embodiment, the site computer functions and processes 101 are performed by the master string sentry, which is the string sentry 70 with the sentry address switch 92 set to "00". In this case, the site data channel 88 is an internal software pipe. It is also possible for the site computer functions and processes 101 to be performed on a separate, stand-alone computer or similar processing device. It is also possible for some of those functions and processes to be distributed to the other (non-master) string sentries.

Figure 6A:
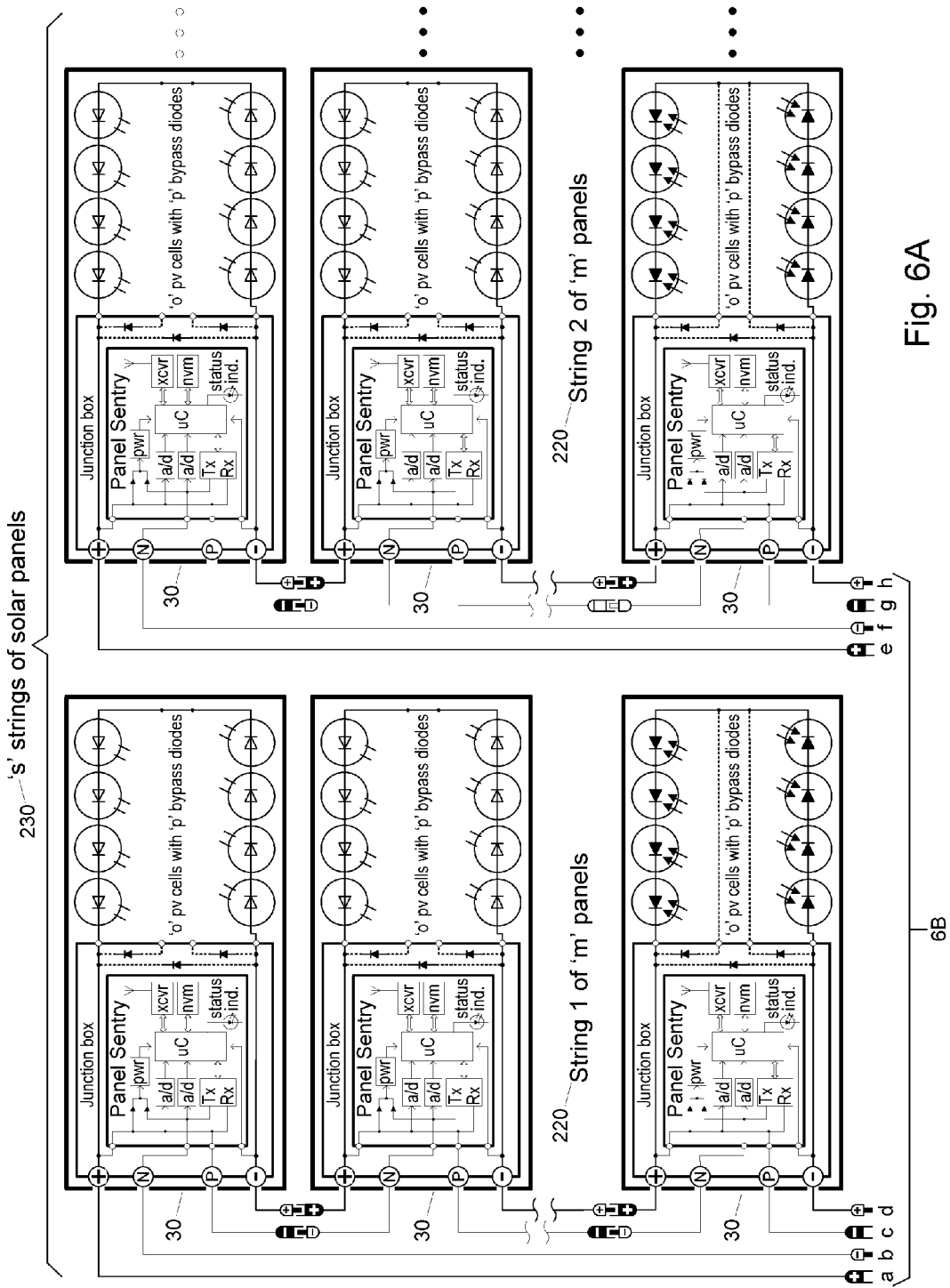
FIGS. 6A and 6B are an electrical schematic view of a photovoltaic power generation system.
Figure 6B:
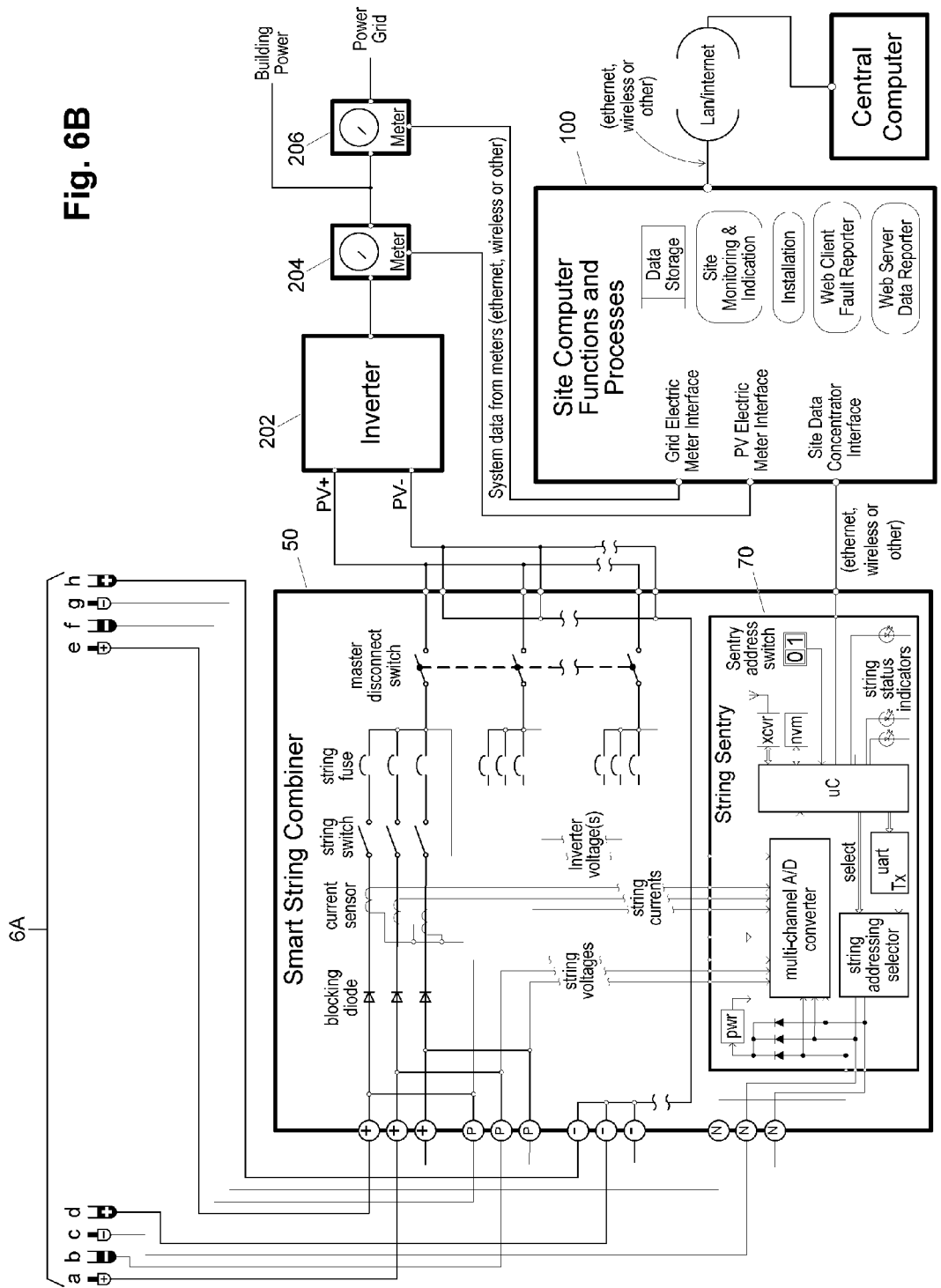

Turning now to FIGS. 6A and 6B, there is depicted a schematic view of a photovoltaic (PV) power generation system such as the conventional system shown in FIG. 7, but including the various elements and improvements described in detail above. In FIGS. 6A and 6B, the smart panels 30 operate to generate D.C. electric power in response to sunlight using a conventional photovoltaic panel. The smart panels 30 further measure output of the panel and communicate fault data and performance information wirelessly via the panel sentry 28.

As further depicted in FIGS. 6A and 6B, the smart panels are combined into a string 220, from which the outputs are combined, in series, to aggregate the voltage from a plurality of panels. The string is similarly connected into a smart string combiner 50, thereby providing a means for reporting diagnostic and monitoring information for the string during operation. Such information includes, but is not limited to, individual smart panel 30 performance along with wire breaks/faults in the string. This string of smart panels also provides a means for automatically establishing addresses for each smart panel 30 in the system, derived from the physical location of the panel in the string determined at the time of installation.

The function of the smart array of panels 230 is to provide a targeted or designed amount of electric power generation, accompanied by diagnostic and monitoring capabilities provided by each smart string of photovoltaic panels 220. The smart string combiner 50 not only provides the interconnections for aggregating power, but further provides fault information and performance data for multiple (e.g. twelve) strings of smart panels. The smart string combiner further prevents power from flowing back into any (underperforming) string of smart panels, as well as providing appropriate switching, fusing and other safety provisions to meet regulatory requirements. The functionality built into each smart sting combiner, in accordance with the present invention facilitates determining component failures, status of switches, various wire faults and provides appropriate real-time visual status indications based on information received from a site computer.

In FIG. 6B, an inverter 202 is also illustrated. The function of the inverter 202 is for converting the D.C. power output from an array of photovoltaic panels or smart panels into A.C. power, and merging the A.C. power with the utility grid. As previously described the system depicted in FIGS. 6A and 6B further includes: a PV electric meter 204 for measuring the A.C. power produced by the inverter(s) 202 attached to the power generation system; a grid electric meter 206 is for measuring the A.C. energy provided by the utility; a site computer for executing functions and processes that apply to the overall management and reporting of data and characteristics for the site, including but not limited to data storage, site monitoring and indication logic, installation, web client fault reporting and web server data reporting, along with various interfaces (grid electric meter 206, the PV electric meter 204 and a local area network (LAN)).

FIG. 7 illustrates an alternate embodiment of panel sentry 28. Alternate panel sentry 29 measures the output voltage of a photovoltaic panel, but does not measure the output voltage of its adjacent panel. It also does not have a wireless transceiver 44, nor does it have a panel location transceiver 40. Instead, it has two wired transceivers, the next panel transceiver 39 and the previous panel transceiver 41. These two transceivers are used to provide bidirectional data communications with a string sentry 70 over a wired communication network, replacing the functionality provided by the wireless panel transceiver 44 included on panel sentry 28. Although depicted as performing the communications over a wired communication channel, the wired embodiment includes traditional networked wiring (e.g., single wire network 24, 26).

The wired network also includes the use of the power conductors as the "wired network" whereby further circuitry (not shown) associated with the panel sentry 29 may be employed to impose communications signals over the D.C. power conductors so as to permit the use of the D.C. power wiring (conductors) as the wiring component of the communication network.

Figure 8:
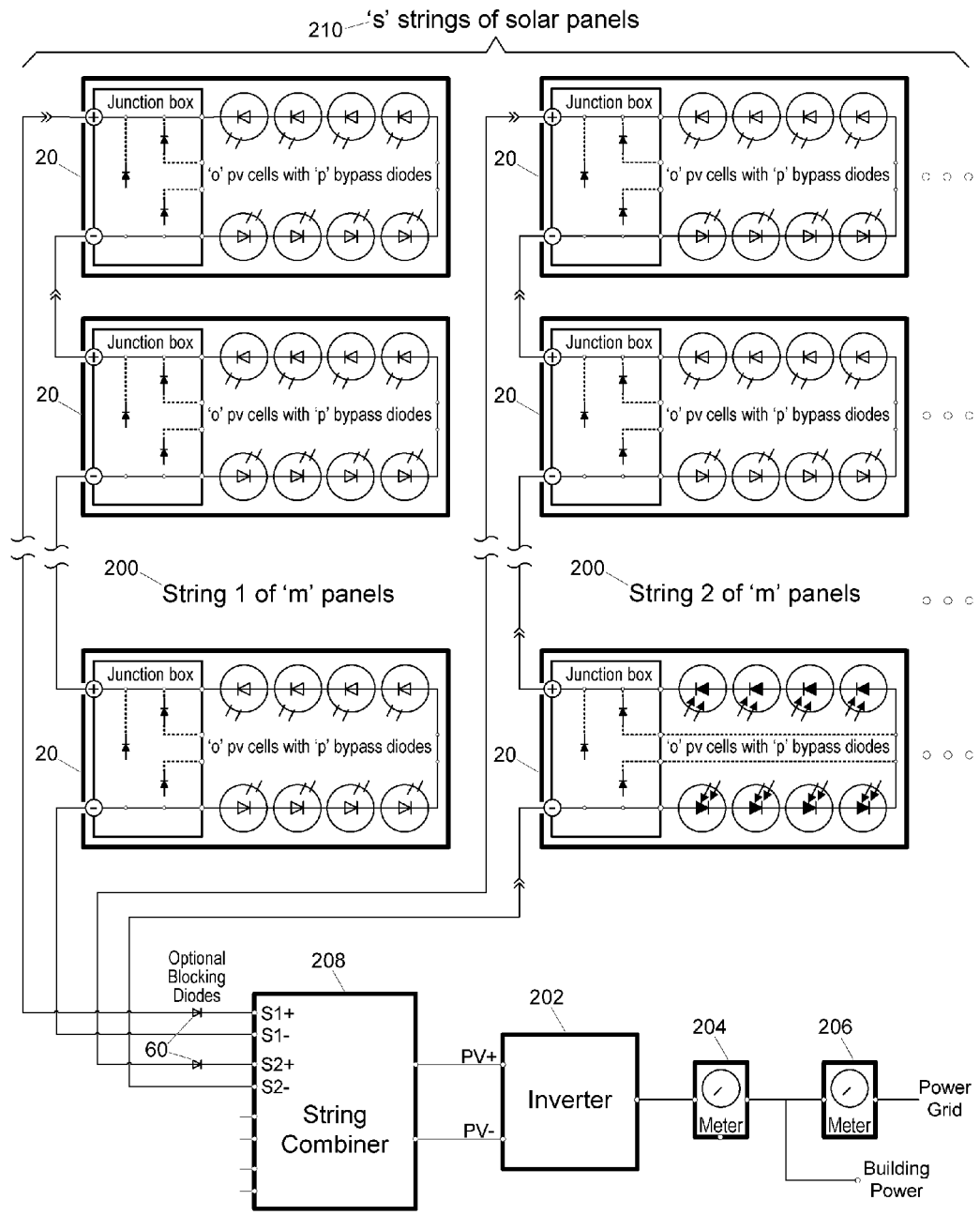
FIG. 8 is an electrical schematic view of a conventional photovoltaic electric power generation system using multiple strings of photovoltaic panels.

In the embodiment of FIG. 8, the next panel transceiver 39 communicates through the next panel terminal 24 that is wired to the previous panel terminal 26 of the next solar panel in a series string, which is connected to the previous panel transceiver 41 of that solar panel. In the case of the first solar panel in a series string 220, the previous panel transceiver 41 communicates directly to the string sentry 70 via a wire from the previous panel terminal 26 to the first panel terminal 58 of the smart string combiner 50. Communications to or from the string sentry from other solar panels in a series string after the first panel are relayed by each of the panel sentries that are between the string sentry and the other solar panel that is sending or receiving the communications. The previous panel transceiver 41 also replaces the panel location functionality that was provided by the panel location transceiver 40. All other elements of alternate panel sentry 29 provide the same functionality as in panel sentry 28.

FIG. 8 is an electrical schematic view of a conventional electric power generation system using multiple strings of conventional photovoltaic panels, to which the present invention(s) might be applied. This schematic represents common practice for interconnecting photovoltaic panels in electric power generating sites. These sites typically use the same panel for the entire site, and the panels are wired in strings of 10-20 panels such that the maximum voltage for the string of panels 200 is between 500 V.D.C. and 600 V.D.C. A typical commercial electric power generation site installed in 2004 had a peak power of 150 kilowatts, and was constructed using 1,000 photovoltaic panels, configured in 70 panel array 210(s) that contained 15 panels in each string of panels 200. In order to reduce the number of wires from 70 pairs to one pair, it was common practice to terminate some number of strings of panels in a string combiner 208. Smaller commercial electric power generation sites of 30 kilowatts or less might use a single string combiner 208, however 150 kilowatt systems would typically use six or more. The D.C. output of the string combiner 208(s) was typically attached to an inverter 202, which converted the D.C. power to A.C. and merged it, through a PV electric meter 204, with the A.C. power being provided by the power grid through the Grid electric meter 206.

Having described the various embodiments of the present invention, attention is now turned to the manner in which the system may be employed, and in particular to the various methods of operation of several of the afore-described components. The following description is set forth relative to functions depicted in FIGS. 9-14, and specific aspects of each will be described relative to the following methods, where the methods bear the indicated reference number.

Figure 12:
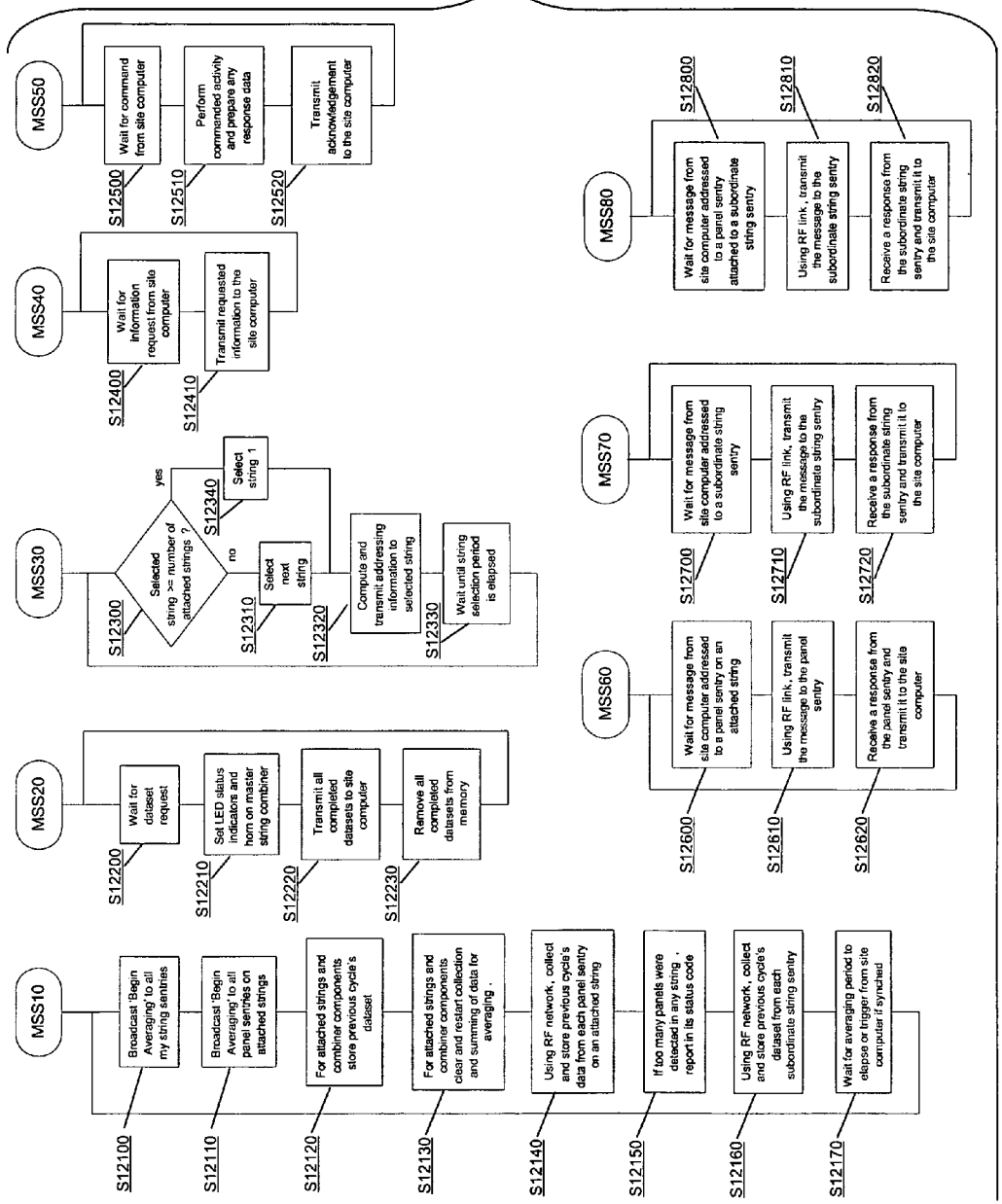
FIG. 12 is an illustration of several sub-processes carried out by a master string sentry in accordance with an aspect of the present invention.

The various processes executed by a master string sentry 70 are illustrated in FIG. 12.

Method MSS10 is a method for periodically obtaining, storing and making available to the site computer a dataset comprising contemporaneous data averaged over an averaging period from every panel sentry 28 and string sentry 70, including the master string sentry, in the solar panel array 230.

Starting at S12100, the master string sentry broadcasts a 'begin averaging' trigger to all string sentries for which this one is master. The master also records current time as a 'date and time stamp'. As used in this regard, the term broadcast means a single message that is sent or transmitted with the intent that it may be received simultaneously by all designated recipients.

In response to the broadcast, the string sentries each in turn broadcast a 'begin averaging' trigger to all panel sentries on the strings attached to the master string combiner.

At S12120, the master stores (with date and time stamp above) the previous cycle's data for all strings attached to and components within the master string combiner. The data stored may include maximum, minimum and average string voltages, maximum, minimum and average string currents, various voltages from points within the string combiner useful for determining switch positions, open fuses, bad diodes, output voltage to the inverter(s), etc. In actual practice data may be time stamped elsewhere for fault recovery etc. in case a master string sentry is temporarily out of operation. However, for purposes of this description of normal operation, the master string sentry is the only point where time stamping is performed. An event log in the central computer is time-stamped as well, but is not necessarily correlated with the data collection.

At S12130, the master string sentry clears and restarts averaging of data for all strings attached to and components within the master string combiner. At S12140, the master collects (send request and receive response) and stores (with date and time stamp above) the previous cycle's data from all panel sentries on the strings attached to the master string combiner. Each request includes status information for the panel which will be used to set the panel's LED status indicators. During the collection, a request is sent to the next panel address beyond the expected end of each string as represented by S12150. A response indicates there are too many panels in the string. This information is incorporated into the status code for the string, which is part of each cycle's stored dataset.

The master string sentry also collects (send request and receive response) and stores (with date and time stamp above) the previous cycle's data from all other string sentries for which this one is master, as represented by S12160. Each request includes status information for the string sentry and for each of its attached panels which will be used to set LED status indicators for those devices.

Wait until averaging period has elapsed. In normal operation this period may be, for example, 6 minutes, while in installation mode (a mode which may be entered via e.g. hardware or software switch at a string sentry or site computer) it will be much shorter (e.g. 10 seconds) in order to provide timely feedback to an installing technician. The MSS10 processing cycle is then repeated.

Figure 14:
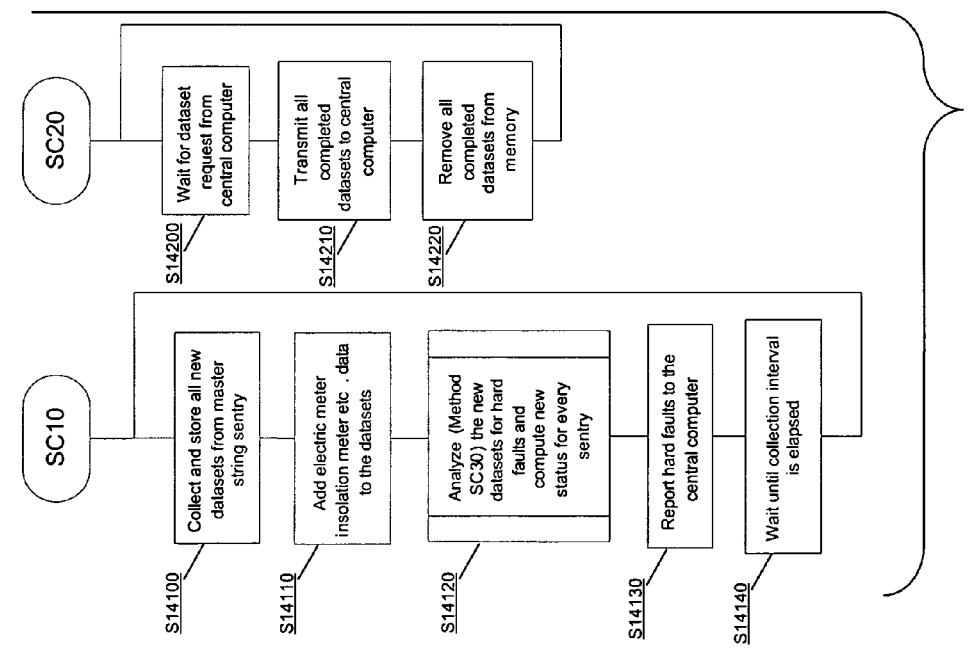
FIG. 14 is an illustration of flowcharts for processes carried out by the site computer in accordance with aspects of the disclosed embodiments.

Method MSS20, also depicted in FIG. 14, is a method for transferring to the site computer on request, one or more of the full array datasets referenced in method MSS10 above.

The process initiates upon receipt of a request from the site computer for new datasets (a dataset is the data stored in one cycle above), S12200. The request includes status information for every string sentry and panel sentry which will be used to set LED status indicators for those devices as reflected by S12210. In addition to visual indicators, the present process contemplates an audible signaling device or indicator such as a horn, which may also be used on the string combiner in the case where, for example, there are too many panels in a string.

Accordingly, step S12210 sets the LED status indicators on the master string combiner according to the status information received above for the master string sentry.

Next, at S12220 all completed datasets are transmitted to the site computer 100. Subsequently, those datasets are removed from the local memory to reclaim the space and the process is completed until the next cycle.

Referring next to Method MSS30, the illustration of FIG. 12 depicts a method for automatically maintaining, within the non-volatile memory 46 of each panel sentry in a string attached to this master string combiner, a radio frequency (RF) network address which represents its wiring position or (by implication) geographic position in the solar panel array, using information passed over the wired channel from this string sentry to the first panel in each string. It is invoked on a periodic basis (e.g. every 30 seconds) not only during installation but as long as the monitoring system is operational, so that if, for example, a panel is replaced, the new unit is automatically addressed and integrated into the system within a few seconds.

In particular the process, using string addressing selector 78, selects from those strings attached to the master string combiner, the string that will receive addressing information as represented by S12300. For example, if twelve strings can be attached to the master string combiner, and last string to receive addressing information was numbered twelve, select the string numbered one (S12340). Otherwise select the next numbered string (e.g. if the last string selected was numbered two, select the string numbered three) as represented by S12310.

At S12320, using the serial addressing transmitter 80, the string sentry transmits via string addressing selector 78 to the first panel in the string addressing information comprising the number of solar panels in the string and the physical (wiring) location for the master string combiner as designated by string number and panel number (00). The number of solar panels is derived from the master string combiner configuration information. The string number is derived from the setting of the string sentry address switch and the selected position of string addressing selector 78.

Next, the process waits until the string selection period (e.g. thirty seconds in normal operation or one second in installation mode) is elapsed as depicted by S12330, and the process is then repeated indefinitely to facilitate installation and panel replacement of panels.

The master string sentry Method MSS40, also illustrated as one of the Master String Sentry operations of FIG. 12, is a method for transferring to the site computer, on request, any non-dataset information such as configuration data stored in the master string sentry's non-volatile memory.

Initially, as represented by S12400, the master receives a request from the site computer for non-dataset information such as stored panel manufacturer's information or master string sentry configuration or calibration information. Subsequently, the master transmits the requested information to the site computer As represented by S12410 before the process completes and awaits a subsequent request.

Method MSS50 is a simple command-response process for receiving and responding to an asynchronous command received from the site computer. As indicated by S12500, the master string sentry first waits to Receive a command from the site computer. The command requires that some action be performed by the master string sentry and may include data required to perform that action. S12510 represents the master performing the required operation (which may be to update stored configuration information with the data provided with the command, or upgrade firmware with the data provided with the command). Upon completion, the master transmits an acknowledgment (which may contain some data) to the site computer as represented by S12520.

Method MSS60, also found in the master string sentry methods of FIG. 12, is directed to a method for processing and responding to an asynchronous command received from the site computer and addressed to a panel sentry in a string which is attached to the master string sentry.

At S12600, the master receives a request or command from the site computer which is addressed to a panel sentry on one of the strings attached to the string combiner. In response to the request the master transmits the request or command to the addressed panel sentry as indicated by S12610, and awaits the receipt of a response from the addressed panel sentry to transmit that response to the site computer (S12620).

Referring next to Method MSS70, there is shown a method for processing and responding to an asynchronous command received from the site computer and addressed to a subordinate string sentry.

At S12700, the master waits for and receives a request or command from the site computer which is addressed to one of the string sentries for which this sentry is master. Subsequently, the master transmits the request or command to the addressed string sentry (S12710). Upon receiving a response from the addressed string sentry, the master transmits that response to the site computer as represented by S12720 and then loops to await a subsequent command or request.

Lastly, Method MSS80 is a method for processing and responding to an asynchronous command received from the site computer and addressed to a panel sentry in a string which is attached to a subordinate string sentry. It will be appreciated that this process is similar in nature to Method MSS70, but includes an additional layer of communication to reach the panel sentry.

Starting at S12800, the master receives a request or command from the site computer which is determined to be addressed to a panel sentry attached to one of the string sentries for which the receiving string sentry is a master. Upon receipt, the communication network, for example the wireless RF link, is employed to transmit the request or command to the string sentry (S12810), which will in turn initiate communication with the panel sentry (not shown), before a response is received from the addressed string sentry and that response is transmitted (S12820) to the site computer.

Having described several of the methods carried out by the master string sentry, attention is now turned to the processes accomplished by a non-master string sentry. The various processes performed are depicted, for example, in FIG. 13.

Figure 13:
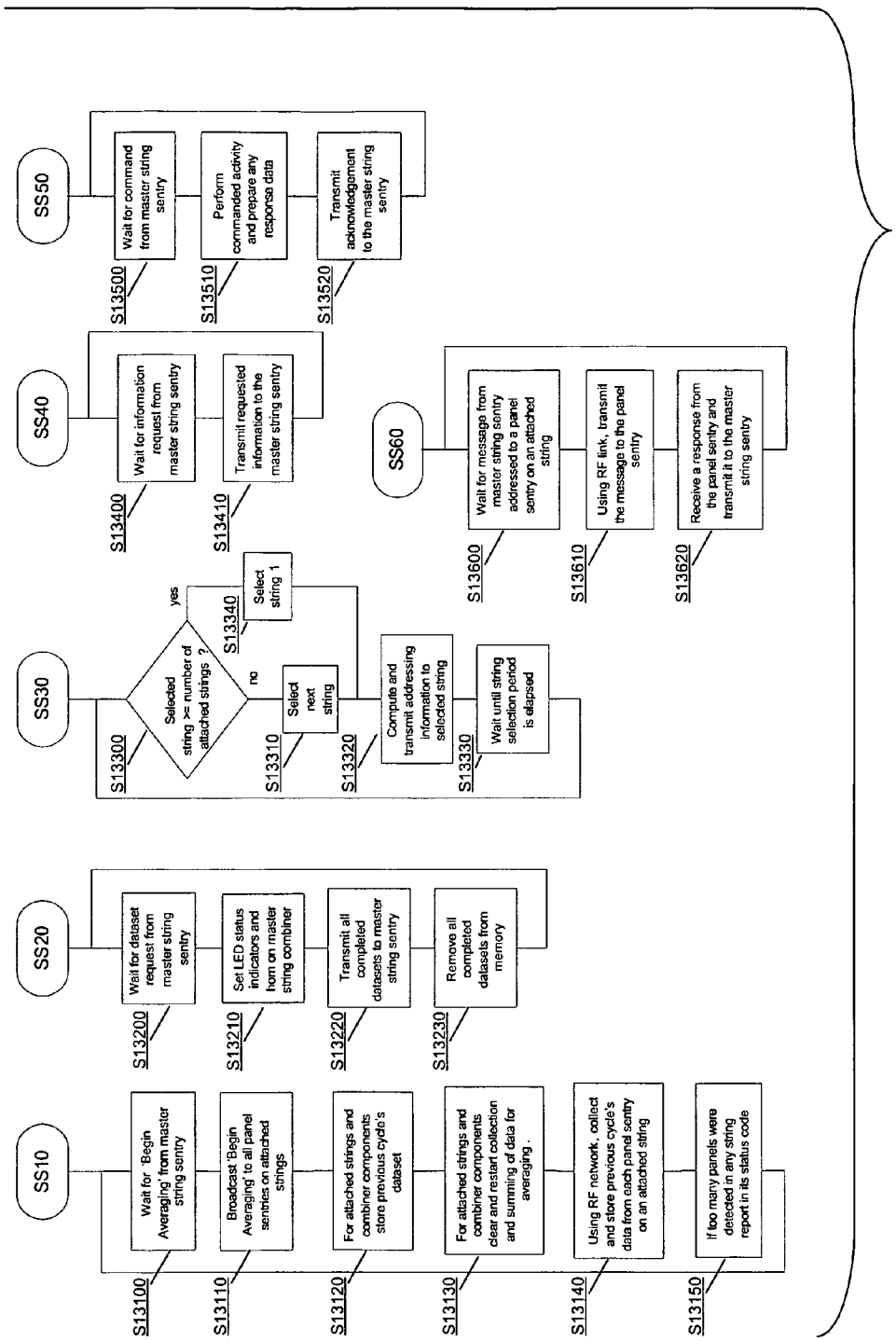
FIG. 13 is an illustration of several subprocesses carried out by a string sentry (non-master) in accordance with the present invention.

Referring to FIG. 13, Method SS10 is a method for obtaining, storing and making available to the master string sentry a dataset comprising contemporaneous data, averaged over a period since the most recent 'begin averaging' trigger, from this string sentry and all panel sentries on the strings attached to this string combiner.

At S12100, the string sentry receives the 'begin averaging' trigger from master string sentry. At S12110, the sentry broadcasts (one message received by all) a 'begin averaging' trigger to all panel sentries on the strings attached to the string combiner. At S13120, the string sentry stores the previous cycle's data for all strings attached to and components within the string combiner. The data stored may include maximum, minimum, and average string voltages, maximum, minimum and average string currents, various voltages from points within the string combiner useful for determining switch positions, open fuses, bad diodes, output voltage to the inverter(s), etc.

Next, at S13130, the string sentry clears and restarts averaging of data for all strings attached to, and components within, the string combiner. At S13140, the string sentry collects (send request and receive response) and stores the previous cycle's data from each panel on the strings attached to the string combiner. Each request includes status information for the panel which will be used to set the panel's LED status indicators.

During the above collection, a request is sent to the next panel address beyond the expected end of each string (S13150). A response to the test request indicates there are too many panels in the string. This information is incorporated into the status code for the string, which is part of each cycle's stored dataset.

Turning next to Method SS20, the method is directed to transferring to the master string sentry, on request, one or more of the string combiner datasets referenced in Method SS10 above. The transfer method starts at S13200 upon receipt of a request from the master string sentry for new datasets (a dataset is the data stored in one cycle). The request includes status information for the string sentry and for each panel sentry in its attached strings which will be used to set LED status indicators for those devices as reflected by S13210. As described above, the status information sent to a string sentry may also be used to turn on a horn or other signaling or indicator device on the string combiner—for example, in the case where there are too many panels in a string.

At S13210 the LED status indicators on the string combiner ae set according to the information received S13200. Subsequently, at S13220, the string sentry transmits all completed datasets to the master string sentry and removes those datasets from the local memory to reclaim the space as represented by S13230.

Method SS30 is a method for automatically maintaining, within the non-volatile memory 46 of each panel sentry in a string attached to this string combiner, an RF network address which represents its wiring position or (by implication) geographic position in the solar panel array, using information passed over the wired channel from this string sentry to the first panel in each string. It is invoked on a periodic basis (e.g. every 30 seconds) not only during installation but as long as the monitoring system is operational, so that e.g. if a panel is replaced, the new unit is automatically addressed and integrated into the system within a few seconds.

Using string addressing selector 78, select (S13300), from those strings attached to the string combiner, the string that will receive addressing information. For example, if twelve strings can be attached to the string combiner, and last string to receive addressing information was numbered twelve, select the string numbered one (S13340). Otherwise select the next numbered string (e.g. if last string selected was numbered wo, select the string numbered three) S13310.

Using the serial addressing transmitter 80, transmit via string addressing selector 78 to the first panel in the string (S13320), addressing information comprising the number of solar panels in the string and the physical (wiring) location for the string combiner as designated by string number and panel number (00). The number of solar panels is derived from the string combiner configuration information. The string number is derived from the setting of the string sentry address switch and the selected position of string addressing selector 78. Subsequently, the process waits at S13330 until the string selection period (e.g. thirty seconds in normal operation or one second in installation mode) is elapsed. As illustrated in FIG. 13, Method SS30 is repeated indefinitely to facilitate installation and panel replacement.

Method SS40 is a method for transferring to the master string sentry, upon request, any non-dataset information such as configuration data stored in the string sentry's non-volatile memory. Here again, the process initiates at S13400, upon receiving a request from the master string sentry for non-dataset information, such as: stored panel manufacturer's information, string sentry configuration, or calibration information. Subsequently, the requested information is transmitted to the requesting master string sentry as indicated by S13410.

Method SS50 is directed to receiving and responding to an asynchronous command received from the master string sentry. At S13500, the string sentry receives a command from the master string sentry. The command requires that some action be performed by the string sentry and may include data required to perform that action. Next, the string sentry performs the required operation (which may include updating stored configuration information with the data provided with the command or upgrade firmware with the data provided with the command) S13510. Then the sentry transmits an acknowledgment S13520, which may contain some data, to the master string sentry.

Lastly, Method SS60 is a method for processing and responding to an asynchronous command received from the master string sentry and addressed to a panel sentry in a string which is attached to this string sentry. As noted above, Method SS60 is the string sentry response to the master's MSS80 process (FIG. 12).

At S13600, the string sentry waits to receive a request or command from the master string sentry that is addressed to a panel sentry on one of the strings attached to the string combiner. The string sentry then uses its transmitter 84 to transmit the request or command to the addressed panel sentry. Subsequently, the string sentry receives a response from the addressed panel sentry and transmits that response to the master string sentry as represented by S13620.

Figure 10:
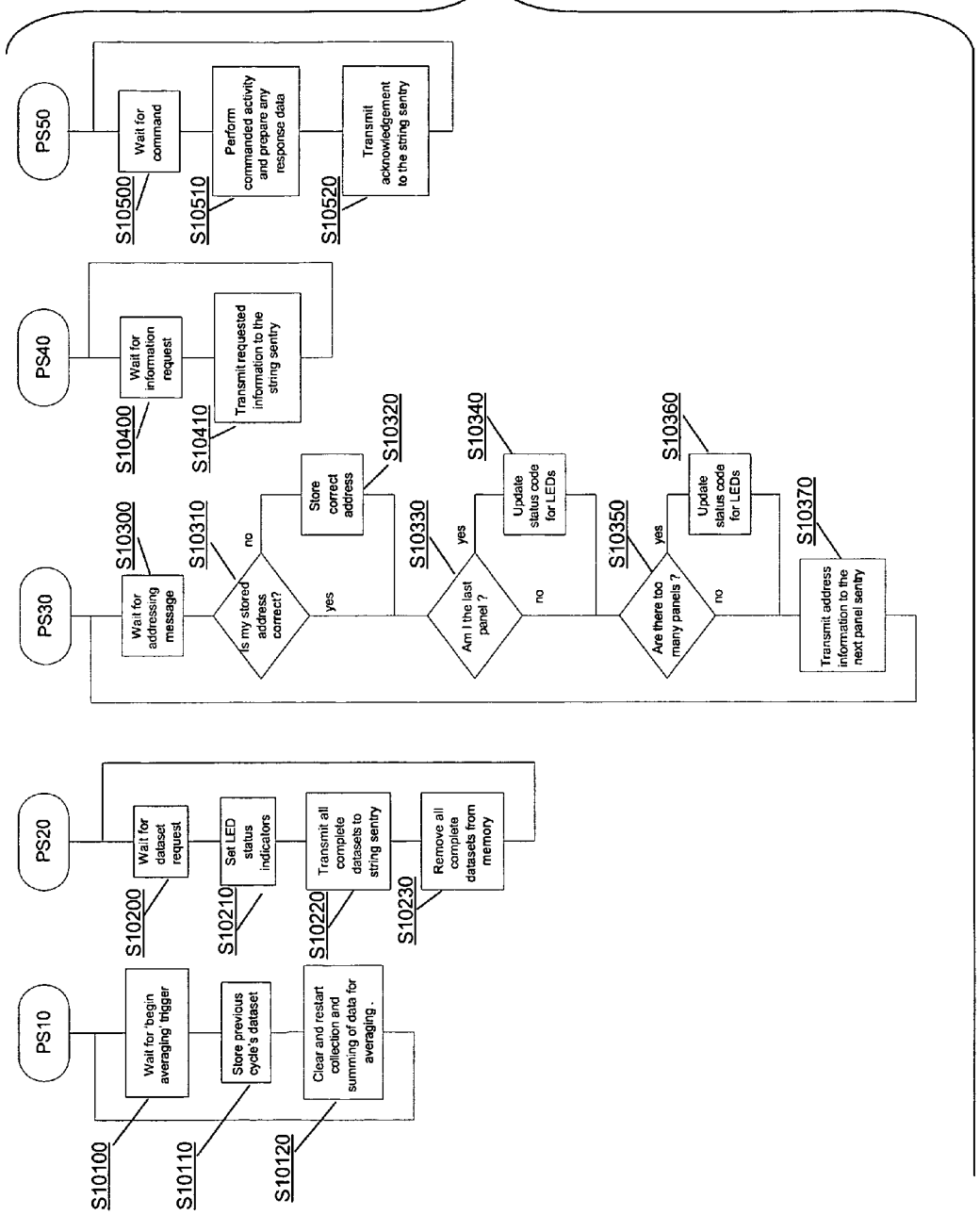
FIG. 10 is a representation of several sub-processes that are performed by a power sentry in accordance with the present invention.

Next, reference is made to the various processes carried out in association with the panel sentry, for example those processes illustrated in FIG. 10.

Method PS10, for example, is a method for obtaining, storing and making available to the string sentry a dataset comprising contemporaneous data, averaged over the period since the most recent 'begin averaging' trigger, from this panel sentry.

The method starts at S10100 upon receipt of a 'begin averaging' trigger from the string sentry to which this panel's string is connected. At S10100, the panel sentry stores the previous cycle's data for this panel. The data stored may include maximum panel voltage, average panel voltage, next panel average voltage, next panel peak voltage, panel temperature, status and data quality information, etc. Subsequently, the panel sentry clears and restarts averaging of data for this panel.

In Method PS20 there is depicted an exemplary method for transferring to the string sentry, upon request, one or more of the panel sentry datasets referenced in Method PS10 above.

Initially, the process begins at S10200 by receiving a request, from the string sentry to which this panel's string is connected, for new datasets (a dataset is the data stored in one cycle above). At S10210, the status code contained in the request is sued to set the state of the LED status indicators on the panel sentry. Subsequently, the panel sentry transmits all completed datasets to the requesting string sentry as represented by S10220. This transmission may also include a status code containing such information about the health etc. of the panel sentry and panel as may be deemed useful. Lastly, those datasets from the local memory are removed in order to reclaim the space, S10230.

Method PS30, also illustrated as one of the panel sentry processes in FIG. 10, is a method for automatically maintaining, within a panel sentry's non-volatile memory 46, an RF network address which represents its wiring position or (by implication) geographic position in the solar panel array. The process uses information passed over the wired channel from the previous panel sentry or string sentry. Method PS30 is invoked on a periodic basis (e.g. every 30 seconds) not only during installation but as long as the monitoring system is operational, so that if, for example, a panel is replaced, the new unit is automatically addressed and integrated into the system within a few seconds.

At S10300 the panel sentry waits to receive, via panel location transceiver 40, an addressing information message from the string sentry to which this panel's string is connected. Addressing information comprises the number of solar panels in the string and the physical (wiring) location for the master string combiner as designated by string number and panel number.

AT S10310, the panel sentry compares the received string number and panel number with the stored string number and panel number which comprises the RF network address for this panel sentry. If the stored string number is not equal to the received string number or the stored panel number is not equal to the received panel number plus one, then S10320 is performed and a new value is stored for this panel sentry's network address. The address comprises the received string number and the received panel number incremented by one.

Next, at S10330, the panel sentry determines if this panel sentry's stored panel number is equal to the received number of panels in the string, then this panel should be the last in the string. Incorporate this information into the status code used to set the state of the LED status indicators on this panel sentry. If this panel sentry's stored panel number is greater than the received number of panels in the string, determined at S10350, then this panel should not have been connected to the string, and this information is incorporated into the status code used to set the state of the LED status indicators on this panel sentry at S10360 (i.e., the LED status will indicate to the installer/technician that the panel should not have been installed on the string). Lastly, the panel sentry transmits to the next panel in the string, if any, via panel location transceiver 40, addressing information comprising the received number of solar panels in the string and this panels sentry's stored string number and panel number as represented by S10370. This process is repeated in response to an addressing information message received via the transceiver 40 and is the manner in which the panel sentries automatically accomplish a self-addressing and "test" of the string integrity. It is also a function that facilitates not only the installation of panels on a string, but the replacement of panels, enabling the panel sentries themselves to determine the "location: within a string and to verify that the panel is appropriately placed on the string (i.e., not too many panels on string).

Method PS40 is a method for transferring to the string sentry, upon request, any non-dataset information such as configuration data stored in the panel sentry's non-volatile memory.

At S10400, the panel sentry receives a request from the string sentry to which this panel's string is connected for non-dataset information such as stored panel manufacturer's information or panel sentry configuration or calibration information. In response the panel sentry transmits the requested information to the requesting string sentry.

Also represented in FIG. 10 is a process for for receiving and responding to an asynchronous command received from the string sentry—Method PS50.

As with other processes, the panel sentry first wait to receive a command from the string sentry to which this panel's string is connected, S10500. The command requires that some action be performed by the panel sentry and may include data required to perform that action. Once received, S10510 performs the required operation (which may be, for example, a request to update stored configuration information with the data provided with the command, or upgrade firmware with the data provided with the command). Once received the panel sentry then transmits an acknowledgment (which may contain some data) to the requesting string sentry as indicated by S10520.

In an alternative embodiment, the alternate panel sentry 29, described above, may perform the following process as an alternative to PS10 described above relative to FIG. 10.

With this method (Method APS10) on the alternate panel sentry 29, a site computer, in combination with a master string sentry or a string sentry can collect fault data and performance information from a series-string of smart solar panels, and more particularly, from the alternate panel sentries mounted thereon. This process begins by the site computer 100 initiating a request for information from a particular string of solar panels 220 in the array of solar panels 230 referenced in FIGS. 6A and 6B. The string sentry for the particular string of solar panels selects that string address using the string addressing selector and initiates bi-directional communication with the string by sending a query.

Figure 11:
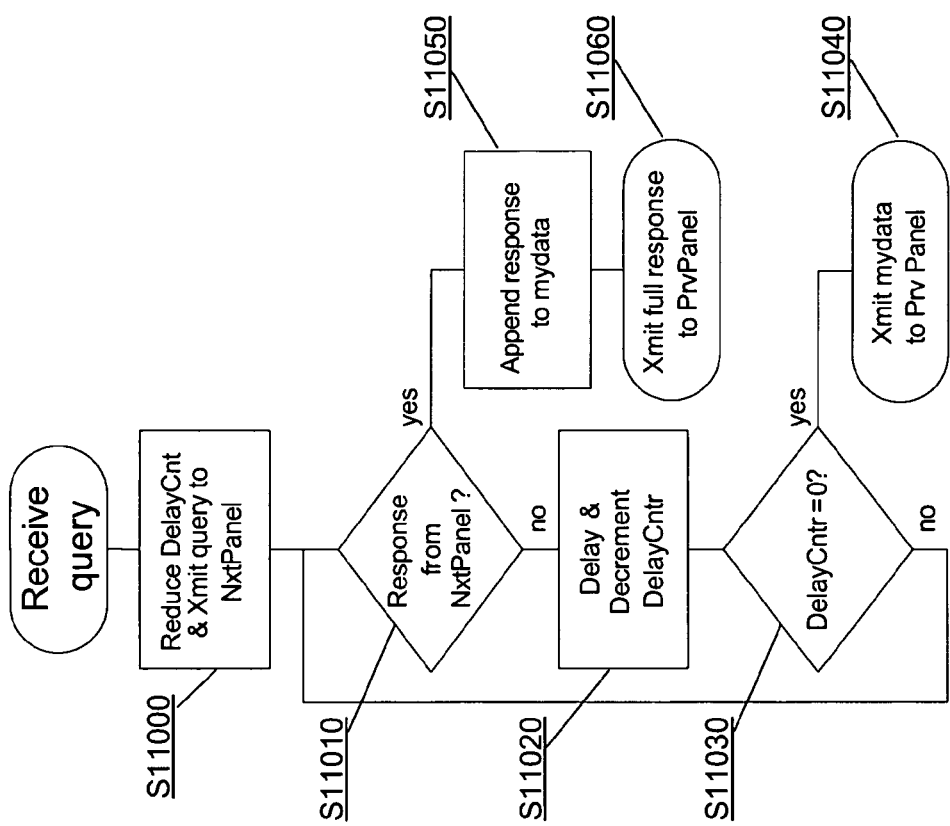
FIG. 11 is a flowchart depicting the serial communication between panel sentries in an embodiment of the present invention.

These queries are received, and responses are transmitted, by the alternate panel sentry 29, at the previous panel transceiver 41 as described in FIG. 7. The panel sentry transmits queries, and receives responses, by the next panel transceiver 39 as described relative to FIG. 7. Each panel sentry in the string is assumed to be running the method described in FIG. 1. Referring to FIG. 11, when a query is received, in step S11000, the panel sentry receiving the query reduces a delay count included with the query appropriately and transmits the query to the next photovoltaic panel in the series string using the next panel transceiver 39. In step S11010 it then checks for a response from the next photovoltaic panel transceiver. If none is received, then in step S11020 the panel sentry decrements its delay-counter and tests it in step S11030. If the delay counter value is greater than zero, it returns to step S11010 and once more looks for a response from the next panel transceiver. Eventually the query will reach the last panel sentry in the series-string which, having the shortest initial value in its delay counter, will time out in step S11030 and then transmit its fault data and performance information to the previous panel transceiver 41 in step S11040.

Since the previous panel sentry in the series-string had a longer value in its delay counter, it will still be waiting for a response from the next panel. When that response is received in step S11010, that panel sentry proceeds to step S11050 and appends the response that it just received at the next panel transceiver 39 to its own fault data and performance information. It then transmits the full record of fault data and performance information using the previous panel sentry transceiver 41 as represented by S11060.

When this information is received on the bidirectional communications port by the string sentry, it represents a full record of fault data and performance information for all the panel sentries in the series string that responded. If, for example, there was supposed to be a string of twelve solar panels, and they all responded properly the record received would represent twelve sets of information. The string sentry would then simply return the aggregate fault data and performance information to the site computer for its use. On the other hand, should too many sets of information be received, the string sentry would determine that there is a fault condition because "the string has too many panels". Or, should too few sets of information be received, the string sentry would determine that there is a fault condition because 'the string has only N panels', where N is a number less than it should be.

Note that this implementation, using alternate panel sentries 29, provides less information than the preferred embodiment using panel sentries 28. It does, however, provide a large amount of useful fault data and performance information even in the absence of a wireless communication network. Note also that the alternate panel sentry 29 addressing in this embodiment is implicit, in that the address of a given alternate panel sentry 29 is implied by the order in which information is received at the string sentry. This approach is consistent with the claims in that the addresses for all the alternate panel sentries in the array are naturally derived from the wiring of the series-strings 220, thereby not requiring any special installation procedures or prior data/knowledge relative to a panel before it is installed.

Reference is now made to FIG. 14, where flowcharts for Site Computer processes SC10 and SC20 are depicted.

Method SC10 is a method for periodically obtaining, storing and making available to the central computer one or more datasets comprising contemporaneous data averaged over an averaging period from every panel sentry and every string sentry, including the master string sentry, in the solar panel array, as well as the data from array related devices such as electric meters and solar insolation meter.

SC10 starts with step S14100, where it collects (send request and receive response) and stores all new datasets from the master string sentry associated with this site computer. The request includes status information for every string sentry and every panel sentry associated with this site computer. The status information will be used to set LED status indicators for those devices. At S14110, the process stores, with each dataset, any additional array related data such as the power readings from the photovoltaic electric meter 204, grid electric meter 206, and array insolation meter. Next, the process analyzes, in accordance with Method SC30 described and depicted in FIG. 9, the data in the new datasets for hard faults (wire breaks, non-functioning hardware etc.) and stores the results with each dataset. The step is represented by S14120. The results of this analysis, integrated with status information provided by the central computer, determine the status information that will be sent to the string and panel sentries on the next cycle. At S14130, the site computer reports (e.g., via web client software) any hard faults found to the central computer, and then waits, S14140, until the collection interval is passed. This repetition interval may be, for example, on the order of six minutes during normal operation or as little as about every ten seconds during installation mode and may be synchronized with the master string combiner averaging period.

Also depicted in FIG. 14 is Method SC20, a method for transferring to the central computer on request one or more of the full site datasets referenced in Method SC10 above.

At S14200, the site computer receives a request (as a web client) from the central computer for new datasets (a dataset is the data stored in one cycle as described above). The request includes status information for every string sentry and every panel sentry which will be integrated with the site computer's analysis results above and used to set LED status indicators for those devices. Next, S14210 transmits (as a web server) all completed datasets to the central computer and then removes those datasets from the local memory to reclaim the space, S14220, before returning to await a subsequent request.

Figure 9:
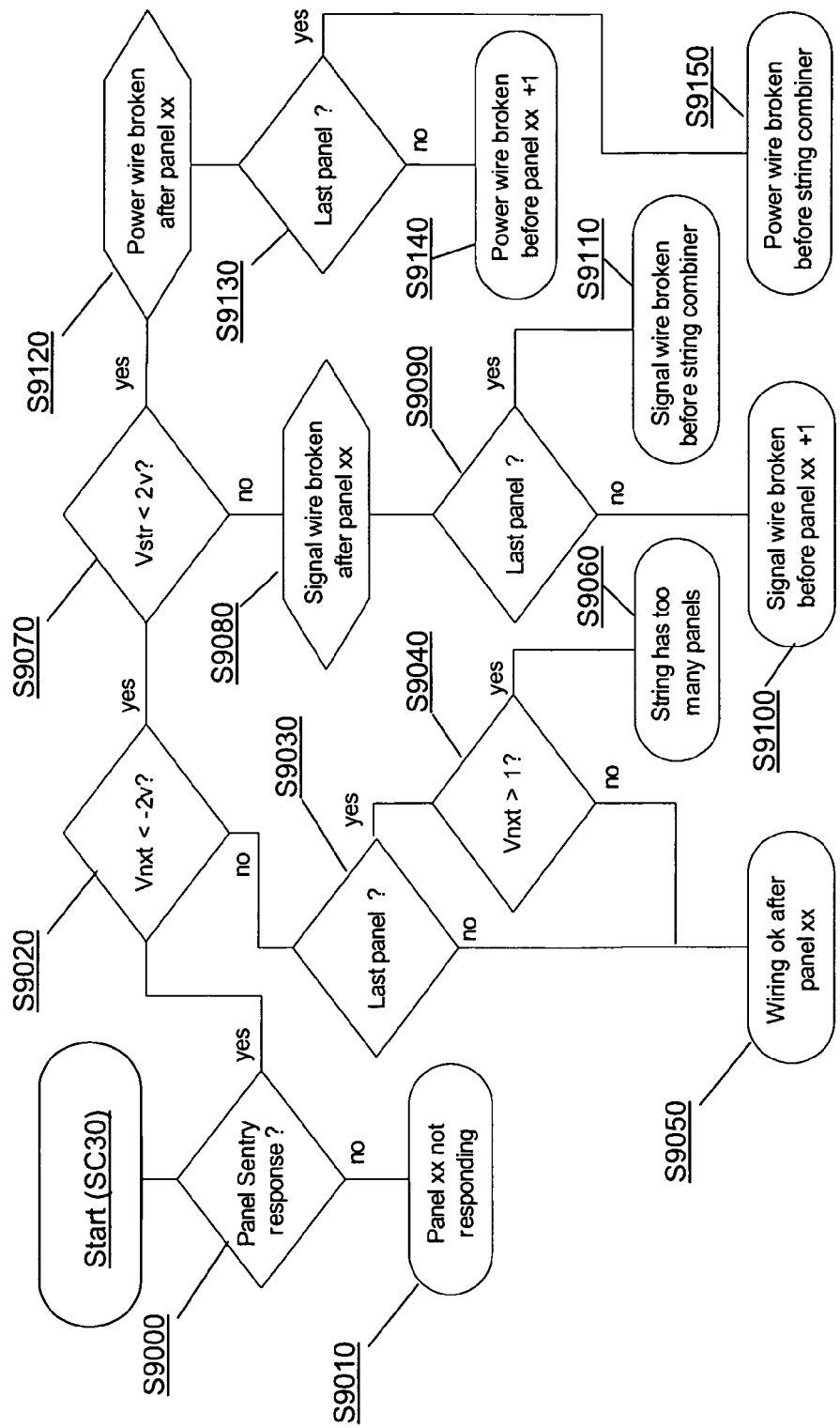
FIG. 9 is a flowchart depicting a method carried out in accordance with an aspect of the present invention directed to analysis and fault detection.

Method SC30, as depicted in FIG. 9, is the method used by the site computer to determine detailed faults and their location(s) within the series-string 220 of the smart solar panel array shown in FIGS. 6A and 6B. This method is repeated for each of the smart solar panels in the string 220.

The method begins by checking, step S9000, whether or not there was a response from the smart solar panel 30, or more particularly the panel sentry (28, 29) associated therewith. The response is expected by the site computer in further response to its prior trigger or polling request. If a response is received from the panel sentry the process continues, and if not, the process sets the panel fault information for the panel being processed to indicate that the current smart solar panel is not responding and exits—step S9010.

Assuming a response is detected at S9000, the next check S9020 is whether the voltage for the next panel (Vnxt) is less than −2 v.d.c. The Vnxt voltage is calculated by subtracting the voltage measured by the panel sentry 28 at the next panel terminal 24 from the voltage measured by the panel sentry at the positive panel terminal 16.)

If Vnxt is not less than −2 v.d.c., it is concluded that there are no wire breaks after that panel, and the process proceeds to check whether or not this is the last panel in the series-string at S9030. If not the last panel in the string, then it is concluded that the wiring is OK after that panel and the method exits with no fault indication S9050. If it is the last panel in the series-string, then a check is made at S9040 to determine if Vnxt is greater than 1 volt. If no, the method exits with no fault indication at S9050 as before. If yes, fault information is set to indicate that the series-string has too many panels in it and the method exits S9060.

Again assuming successful completion of the test of Vnxt at S9020, the next check done by the method is whether Vstr is less than 2 v.d.c. S9070. Vstr represents the voltage at the positive terminal 52 for the series-string as measured by the string sentry 70 and depicted and described relative to FIG. 3.

If Vstr is not <2 v.d.c, then the signal wire after the panel being processed is concluded to be broken and the panel fault information for that panel is set appropriately at S9080. The process continues to check whether the panel being processed is the last panel at S9090 If not, the logic determines that the signal wire is broken before the next panel to be processed, the fault information is set appropriately and the method exits at S9100. If S9090 determines that the last panel was processed, the logic determines that the signal wire is broken before the string combiner and the fault information is set appropriately and the method exits at S9110.

Assuming that Vstr is <2 v.d.c as tested at S9070, then the power wire after the panel being processed is concluded to be broken and the panel fault information for that panel is set appropriately at S9120. The process continues after S9210 to check whether the panel being processed is the last panel at S9130. If not, is the logic determines that the power wire is broken before the next panel to be processed at S9140, the fault information is set appropriately and the method exits. If so, representing an affirmative response at S9130, the logic determines that the power wire is broken before the string combiner and the fault information is set appropriately before the method exits at S9150.

Figure 15:
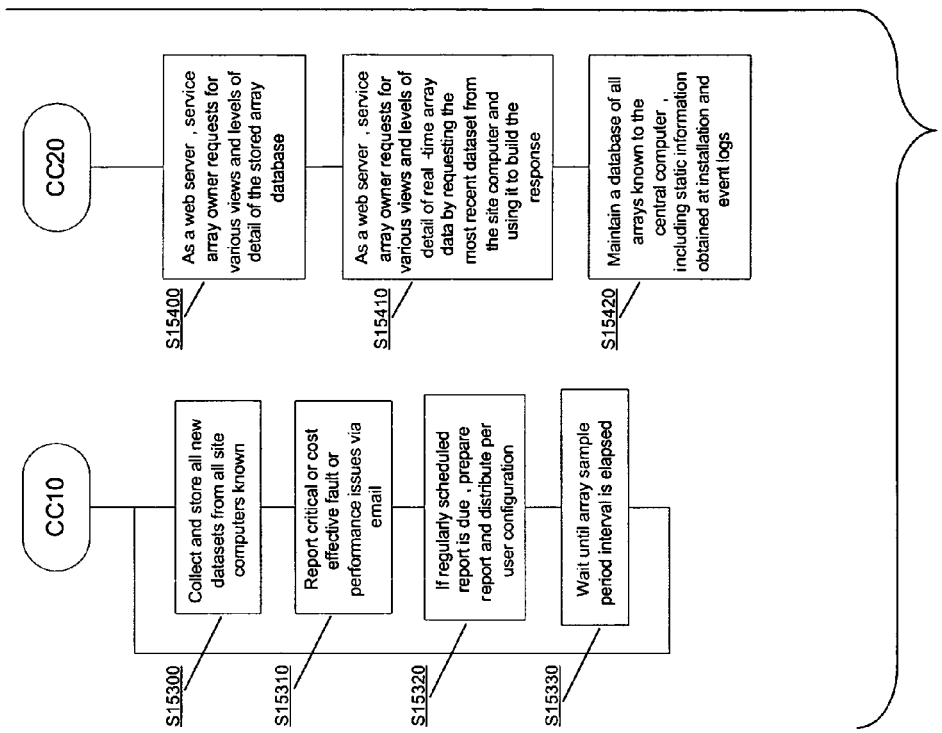
FIG. 15 is an illustration of flowcharts for processes carried out by the central computer in accordance with aspects of the disclosed embodiments.

Turning next to FIG. 15, depicted therein are flowcharts for exemplary processes that may be carried out by a central computer (FIG. 6B; 610) with which the master string sentry communicates. Method CC10 is a method for periodically obtaining full site datasets from all site computers known to the central computer. The process starts at S15300, where the computer collects (send request and receive response) and stores all new datasets from all site computers known to the central computer. Each request includes status information for every string sentry and every panel sentry associated with that site computer. The status information will be used to set LED status indicators for those devices.

For each site computer, the central computer analyzes the data (S15310) in the new datasets for hard and soft faults and performance issues and stores the results. This analysis uses, but is not limited to using, data from earlier datasets, results of earlier analyses, analysis results and data from other site computers, array temperature, array insolation etc. in order to infer such things as shading or soiling of panels or poor performance relative to other panels in an array or to panels in geographically close locations. For each site computer, if any fault or performance issues are judged either critical or cost effective to repair, the the central computer reports (e.g., via email) full details of the required action to the previously designated organization or individual. For each site computer, if a regularly scheduled report is due, S15320, the computer prepares and makes the report accessible via a web browser interface and if so configured, email or regular mail to a designated individual or organization. The report may include a summary of array performance for the period, including any faults and or performance issues found and or repaired, and any recommendations for future repairs or other actions. Subsequently, the process waits until the array sample period (e.g. one day, one week) has elapsed, S15330, before repeating the analysis/reporting cycle.

Also illustrated in FIG. 15 is Method CC20, which is a method for, as a web server, servicing requests from array owners and maintaining a master database of all known sites.

At S15400, the central computer receives and responds to requests (as a web server) from array owners/managers for various views and levels of detail of the stored database of information relating to their array.

As generally represented by S15410, the computer receives and responds to requests (as a web server) from array owners for various views and levels of detail of near real-time data relating to their array by collecting (send request and receive response) the most recent dataset(s) from the site computer web server and using that data to build the web response. It will be appreciated that the manner of transmitting or displaying the response data may include not only graphical representations of information, but may also include raw data, and may facilitate the export of data into common software platforms (e.g., download of data in format recognizable by a spreadsheet). Similarly, at S15420, the computer maintains a database for each array known to the central computer. The database includes but is not limited to, the following information: GPS location, manufacturers and model numbers of solar panels, inverters, and other equipment associated with the array, owner/manager and contact information, installer and contact information, maintainer and contact information, email addresses for dispatch and reporting, installation date, and a time and date stamped event log including all failures, changes, updates, repairs, etc.

In accordance with aspects of the present invention, it will also be appreciated that the systems and methods described herein also facilitate a method for site installation/configuration of the monitoring system. Method IC10 is a method for the configuration and installation of a solar panel array equipped with the Solar Sentry monitoring system. Initially it is contemplated that a minimal site computer configuration must be entered/downloaded from a remote computer. This configuration requires at least the number of panels per string and perhaps additional statistics. At least one string sentry, and perhaps all string sentries and the site computer must be placed in installation mode while the panel array is being wired. For example, this might be done via a switch on each string sentry and/or site computer, or by issuing a command to the site computer via a remote computer. Installation mode primarily means speeding up the cycle times in the site computer, master string sentry, (non-master) string sentries and panel sentries such that the installing technician gets timely feedback (i.e. updates every few seconds) on the status LEDs of the panel sentries as he/she wires up panels. System features not required to provide this feedback (e.g. storage of datasets at various levels and supporting access by the central computer) may be disabled in the interests of speed during the installation. It is also possible that the installation process, and the speedup, could be done one string sentry at a time as its panels are wired, or by putting all components in installation mode.

Figure 16:
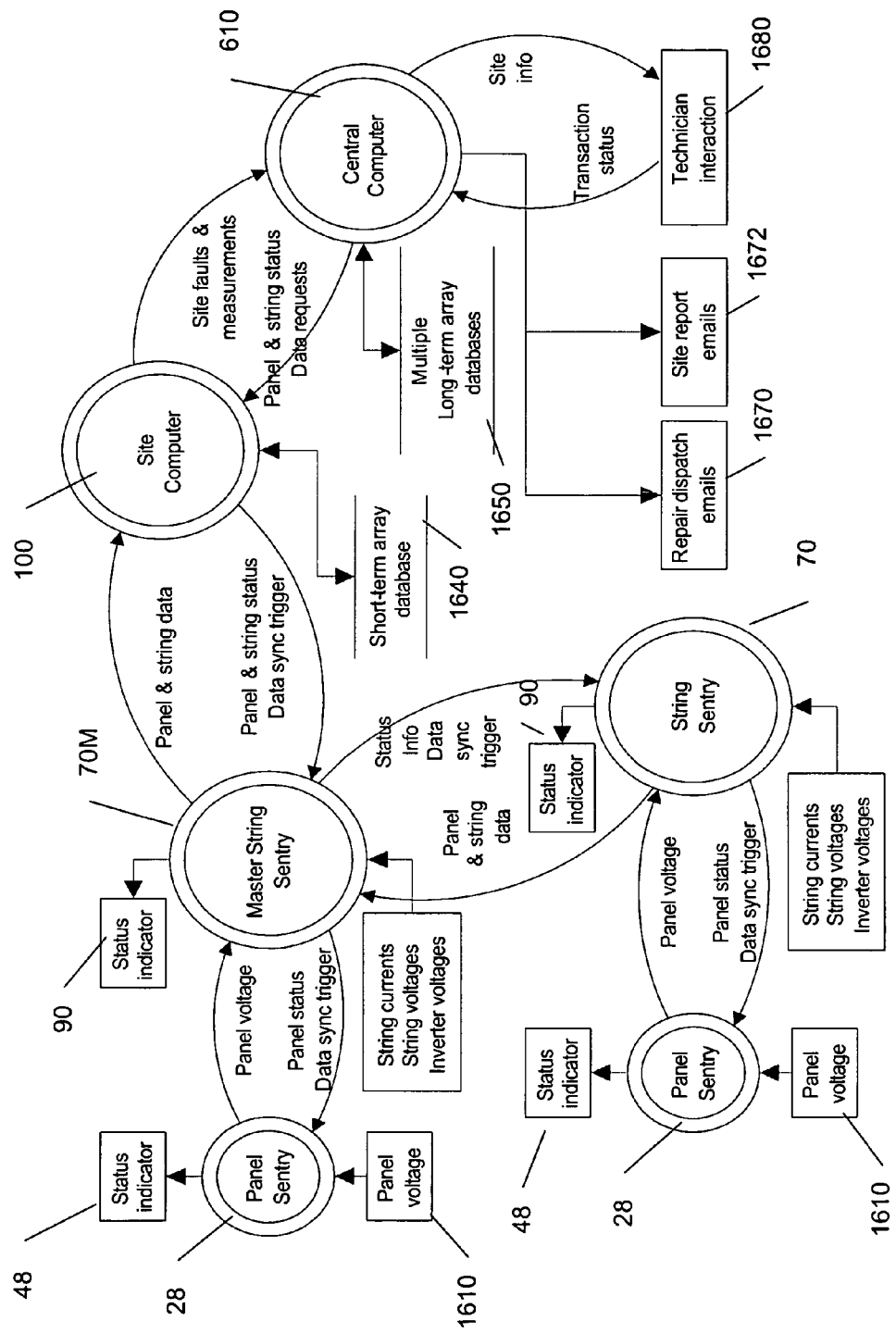
FIG. 16 is a diagram illustrating the flow of information between various components of the disclosed invention.

Referring next to FIG. 16, depicted therein is a data flow diagram illustrating the flow of data and information among and between the various components previously discussed, and particularly in accordance with the methods described above. Starting with the panel sentries 28, the panel sentries receive information or signals from both the current panel as well as a previous panel in the string. As represented by panel voltage signal 1610, the panel sentries may receive the voltage of both the current panel and the previous panel. In both cases, the signals are characterized using the analog-to-digital converters 36 and 38 as illustrated in FIG. 2, for example. The panel sentries each return, to their respective string sentry (master 70M or non-master 70), digital representations of the panel voltages 1610 in response to a trigger. Along with the trigger, each panel sentry receives a status, relayed from the string sentry. The panel status data is employed by the panel sentry 28 to determine the manner in which indicator 48 is to be displayed (including color and/or flashing pattern).

Referring to the string sentries (70 or 70M, both in addition to communicating with the panel sentries, also determine or measure, among other power characteristics, the string currents, string voltages and inverter voltages for the string and inverters connected to or monitored by the string sentry. Furthermore, as illustrated, string sentry 70 and master string sentry 70M exchange panel and string data (sent to master), in response to a status and data synchronization trigger from the master. The string sentries also display a status indicator, again indicating a status assigned by the site computer in response to the data it receives and an analysis as described previously.

In one embodiment, the master string sentry accumulates the data from the panels and other string sentries, and communicates the data to the site computer 100 in response to the status and synchronization trigger. As represented by database 1640, the site computer has a short-term database that us used to store the data accumulated over a plurality of data synchronization cycles. The database is, therefore, popoulated with data transferred from the panels and strings as the data has been passed from the master string sentry 70M to the site computer 100. Periodically, in response to a request from the central computer 610, the site computer 100 uploads data from the database 1640 to the central computer. The central computer, likewise, stored the uploaded site data (panels, strings, site aggregate and related equipment data) in its database as previously described relative to Methods CC10 and CC20.

As depicted in the illustration, central computer 610 is capable of generating external communications such as a repair dispatch e-mail 1670 or a site report e-mail 1672. Both such e-mails would be sent so as to provide information or prompt further attention to the array. As will be appreciated, because of the nature of data communicated and stored by the central computer, including panel sentry performance data and string data, the central computer is able to include in the repair dispatch e-mails specific information as to the nature of any faults or problems, as well as specific panels and strings in or between which any problems are indicated.

Lastly, the data flow diagram of FIG. 16 further illustrates the possibility of the central computer providing, in response to queries or similar user requests, such as a transaction status, site information relating to the performance, maintenance/troubleshooting or similar data relative each site or photovoltaic array being monitored. The present invention contemplates a robust interface for both reviewing and selecting such data, including the ability to not only download site info from the central computer, but also to analyze and review trend data, compare relative sites, etc.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A panel sentry in proximity, electrically connected to, and monitoring both a photovoltaic panel and an adjacent electrical device wherein the panel sentry and the photovoltaic panel, in combination, and the adjacent electrical device are within a series string of electrical devices, each having compatible interface and operating characteristics, said panel sentry comprising:
    a source of power;
    a first circuit for detecting a voltage of the photovoltaic panel and producing a first signal representing the voltage of the photovoltaic panel;
    a second circuit for producing a second signal representing the voltage of the adjacent electrical device in the series string;
    an electrical conductor serially connecting a power terminal of the photovoltaic panel directly to a power terminal of the opposite polarity of the adjacent electrical device in the series string;
    a second electrical conductor, connected to provide a communication channel between the panel sentry and photovoltaic panel combination and the adjacent electrical device, said second conductor carrying a signal indicating a measured voltage of the adjacent electrical device;
    a serial communication device for communicating information to the adjacent electrical device in the series string using at least said second electrical conductor; and
    a transmitter for transmitting at least the first and second signals to at least one external device, said transmitter being powered by the source of power.

2. The panel sentry of claim 1, wherein the first circuit and the second circuit each include a voltage detector, detecting a voltage and producing, respectively, a first signal and a second signal, each representing the respective voltage.

3. The panel sentry of claim 2, further comprising a microcontroller connected to and powered by the source of power, and in bidirectional communication with an external device, the microcontroller being connected to the first and second voltage detectors and receiving the first and second signals therefrom and controlling the transmitter to transmit at least the first and second signals to the external device.

4. The panel sentry of claim 3, further comprising a memory storing at least a digital representation of the first signal.

5. The panel sentry of claim 4, further comprising memory storing a physical location for at least the first photovoltaic panel, including an electrical position within a string connected to a specific combiner.

6. The panel sentry of claim 3 further comprising an indicating device and a receiver for receiving at least one signal from at least one external device, and wherein the operation of the indicating device is responsive to the received signal.

7. The panel sentry of claim 1 further comprising at least one indicating device displaying real-time status for the panel.

8. The panel sentry of claim 1 wherein the source of power includes the photovoltaic panel.

9. The panel sentry of claim 1 wherein the source of power includes a battery.

10. The panel sentry of claim 1 wherein the adjacent electrical device includes a second photovoltaic panel and where the source of power includes the adjacent panel.

11. The panel sentry of claim 1 further comprising a wired connection between the microcontroller and the adjacent electrical device in the series string.

12. The panel sentry of claim 1 further comprising a wireless transceiver electrically connected to the microcontroller and in bi-directional communication with at least one external device.

13. The panel sentry of claim 1 wherein the source of power includes a capacitive storage device.

14. The panel sentry of claim 1 wherein the adjacent electrical device includes a second photovoltaic panel and where the source of power includes, in the alternative, the current panel and the adjacent electrical device.

15. A panel sentry in proximity, electrically connected to, and monitoring both a photovoltaic panel and an adjacent electrical device wherein the panel sentry and the photovoltaic panel, in combination, and the adjacent electrical device are within a series string of electrical devices, each having compatible interface and operating characteristics, said panel sentry comprising:
    a source of power;
    a first panel voltage detector detecting a first voltage produced by the first panel and producing a first signal representing the first voltage;
    a second voltage detector detecting a second voltage produced by the adjacent electrical device and producing a second signal representing the voltage of the adjacent electrical device;
    a bi-directional communication channel with an at least one external device;
    a microcontroller, powered by the source of power, in bi-directional communication via said bi-directional communication channel with the external device, said microcontroller being electrically connected to the first panel voltage detector and the second voltage detector, and receiving the first signal from the first voltage detector and the second signal from the second voltage detector, and transmitting the first signal and the second signal to the external device; and
    a memory storing a digital representation of the first signal and the second signal.

16. The panel sentry of claim 15 further comprising a junction box cover such that at least, the first panel voltage detector, the microcontroller and the memory are mounted in the junction box cover.

17. The panel sentry of claim 15 further comprising a second photovoltaic panel voltage detector, the second photovoltaic panel voltage detector detecting a second voltage produced by a second photovoltaic panel and producing a second signal representing the second voltage, the second detector electrically connected to the microcontroller, the memory storing a digital representation of the second signal.

18. The panel sentry of claim 17 further comprising a digital representation of information relative to the configuration of the second panel, stored in the memory.

19. The panel sentry of claim 17 such that, the second voltage detector comprises an analog to digital converter.

20. The panel sentry of claim 15 further comprising an indicating device.

21. The panel sentry of claim 15 wherein the source of power includes the photovoltaic panel.

22. The panel sentry of claim 15 wherein the source of power includes a battery.

23. The panel sentry of claim 15 wherein the source of power includes a second photovoltaic panel.

24. The panel sentry of claim 15 further comprising a wired connection between the microcontroller and the adjacent electrical device in the series string.

25. The panel sentry of claim 15 further comprising a wireless transceiver electrically connected to the microcontroller and in bi-directional communication with at least one external device.

26. The panel sentry of claim 15 further comprising a digital representation of information relative to the configuration of the panel sentry stored in the memory.

27. The panel sentry of claim 15 further comprising a digital representation of information relative to the configuration of the first panel, stored in the memory.

28. The panel sentry of claim 15 wherein the first voltage detector comprises an analog to digital converter.

29. The panel sentry of claim 15 further comprising a digital representation of an average voltage of the first panel during an update period, the average computed by the microcontroller, the average stored in the memory.

30. The panel sentry of claim 15, further comprising non-volatile memory storing a physical location for at least the first photovoltaic panel, including an electrical position within a string connected to a specific combiner.

31. The panel sentry of claim 15, wherein said panel sentry is attached to the photovoltaic panel.

32. A string sentry for monitoring at least one string of photovoltaic panels comprising:
 a source of power;
 a current detector detecting the total current produced by the string of photovoltaic panels and producing a signal representing the total current;
 a microcontroller, powered by the source of power, in bi-directional communication with an external device and electrically connected to the current detector and electrically connected to the source of power, the microcontroller receiving the signal from the current detector and transmitting the signal to the external device, said microcontroller further receiving signals indicative of a voltage for at least a first photovoltaic panel and an adjacent photovoltaic panel, where said first and adjacent panels are within the string of photovoltaic panels; and
 a memory storing a digital representation of the signal representing the current and representation of the voltage for the first photovoltaic panel and the adjacent photovoltaic panel.

33. The string sentry of claim 32 further comprising a wired connection between the microcontroller and the external device.

34. The string sentry of claim 32 further comprising a wireless transceiver electrically connected to the microcontroller and in bi-directional communication with an external device.

35. The string sentry of claim 32 further comprising a digital representation of information relative to the configuration of the string sentry stored in the memory.

36. The string sentry of claim 32 further comprising a digital representation of information relative to the configuration of a photovoltaic array stored in the memory.

37. The string sentry of claim 32 further comprising a digital representation of information relative to the configuration of a string combiner stored in the memory.

38. The string sentry of claim 32 wherein the current detector comprises an analog to digital converter.

39. The string sentry of claim 32 further comprising:
 a string voltage detector, the string voltage detector detecting the voltage of a string of photovoltaic panels and producing a string signal representing the string voltage, the string voltage detector electrically connected to the microcontroller, the microcontroller receiving the string signal and transmitting a value representing the string signal to the external device, the memory storing a digital representation of the signal representing the string voltage.

40. The string sentry of claim 39 wherein the string voltage detector comprises an analog to digital converter.

41. The string sentry of claim 39 further comprising, a combined voltage detector, the combined voltage detector detecting the combined voltage of at least one string of photovoltaic panels and producing a combined signal representing the combined voltage, the combined voltage detector electrically connected to the microcontroller, the microcontroller receiving the combined signal and transmitting a value representing the combined signal to the external device, the memory storing a digital representation of the signal representing the combined voltage.

42. The string sentry of claim 32 further comprising:
 a combined voltage detector, the combined voltage detector detecting the combined voltage of at least one string of photovoltaic panels and producing a combined signal representing the combined voltage, the combined voltage detector electrically connected to the microcontroller, the microcontroller receiving the combined signal and transmitting a value representing the combined signal to the external device, the memory storing a digital representation of the signal representing the combined voltage.

43. The string sentry of claim 42 wherein the combined voltage detector comprises an analog to digital converter.

44. The string sentry of claim 32 further comprising:
 a string combiner having the current detector, the microcontroller and the memory installed therein.

45. The string sentry of claim 44 further comprising a digital representation of information relative to the configuration of the string combiner stored in the memory.

46. The string sentry of claim 32 wherein the source of power includes a string of photovoltaic panels.

47. The string sentry of claim 32 wherein the source of power includes a battery.

48. The string sentry of claim 32 further comprising a visual signaling device.

49. The string sentry of claim 32, wherein said microcontroller tests the voltage value for the adjacent panel against a threshold to determine if a panel fault exists.

50. The string sentry of claim 32, wherein said microcontroller tests the voltage value for the adjacent panel against a threshold to determine if a string fault exists.

51. The string sentry of claim 32, wherein said memory includes non-volatile memory.

52. A method for monitoring at least one string of photovoltaic panels comprising:
- collecting, using a string sentry, an average value of a current from a string of photovoltaic panels;
- storing, in the string sentry, the average value of the current of the string of photovoltaic panels;
- transmitting the average value of the current from the string sentry to an external computer;
- using a string voltage detector, separated by at least a fuse from the combined string voltage, to detect the voltage of the string of photovoltaic panels, and producing a string signal representing the string voltage,
- storing a digital representation of the signal representing the string voltage in the string sentry; and
- transmitting a value representing the string voltage signal to the external computer, the memory, wherein the external computer compares the received string voltage signal value against at least one other string voltage signal value to detect whether said fuse is open.

53. The method of claim 52 further comprising:
- collecting, using the string sentry, average voltage information from a panel sentry;
- storing, in the string sentry, the average voltage value from the panel sentry; and
- transmitting the average voltage value from the string sentry to the external computer.

54. The method of claim 52 further comprising:
- collecting, using the string sentry, a real-time voltage value from a panel sentry;
- storing, in the string sentry, the real-time voltage value of the panel sentry; and
- transmitting the real-time voltage value from the string sentry to the external computer.

55. The method of claim 54, further comprising using the average voltage from the panel sentry to determine if a panel sentry fault exists in the panel.

56. The method of claim 55, further comprising:
- collecting, using the string sentry, an instantaneous voltage value for an adjacent panel (Vnxt) from a panel sentry;
- storing, in the string sentry, the instantaneous voltage value for the adjacent panel; and
- testing the instantaneous voltage value for the adjacent panel against a threshold to determine if a panel fault exists.

57. The method of claim 52 further comprising:
- collecting, using the string sentry, configuration information from a panel sentry;
- storing, in the string sentry, configuration information of the panel sentry; and
- transmitting the configuration information from the string sentry to the external computer.

58. The method of claim 52 further comprising:
- collecting, using a string sentry, string average voltage information from at least one string of photovoltaic panels;
- storing, in a string sentry, the string instantaneous voltage value of at least one string of photovoltaic panels; and
- transmitting the string instantaneous voltage value from a string sentry to the external computer.

* * * * *